United States Patent
Sato et al.

(10) Patent No.: US 11,371,131 B2
(45) Date of Patent: Jun. 28, 2022

(54) POWDER FOR FILM FORMATION AND MATERIAL FOR FILM FORMATION

(71) Applicant: NIPPON YTTRIUM CO., LTD., Omuta (JP)

(72) Inventors: Ryuichi Sato, Omuta (JP); Naoki Fukagawa, Omuta (JP); Yuji Shigeyoshi, Omuta (JP); Kento Matsukura, Omuta (JP)

(73) Assignee: NIPPON YTTRIUM CO., LTD., Omuta (JP)

( * ) Notice: Subject to any disclaimer, the term of this patent is extended or adjusted under 35 U.S.C. 154(b) by 0 days.

(21) Appl. No.: 16/882,050

(22) Filed: May 22, 2020

(65) Prior Publication Data

US 2020/0283881 A1    Sep. 10, 2020

Related U.S. Application Data

(63) Continuation of application No. 15/536,886, filed as application No. PCT/JP2016/053064 on Feb. 2, 2016, now abandoned.

(30) Foreign Application Priority Data

Feb. 10, 2015   (JP) .................. 2015-024627
Sep. 18, 2015   (JP) .................. 2015-184844

(51) Int. Cl.
*C23C 4/11*    (2016.01)
*C23C 4/10*    (2016.01)
(Continued)

(52) U.S. Cl.
CPC ................ *C23C 4/10* (2013.01); *C04B 35/50* (2013.01); *C04B 35/5156* (2013.01);
(Continued)

(58) Field of Classification Search
CPC .......... C04B 35/50; C04B 35/553; C23C 4/11
See application file for complete search history.

(56) References Cited

U.S. PATENT DOCUMENTS

2002/0018902 A1    2/2002   Tsukatani et al.
2002/0160189 A1    10/2002  Wataya et al.
(Continued)

FOREIGN PATENT DOCUMENTS

JP    2005-97685 A    4/2005
JP    2014-40634 A    3/2014
(Continued)

OTHER PUBLICATIONS

U.S. Appl. No. 15/536,886, filed Jun. 16, 2017.
(Continued)

*Primary Examiner* — Mark Ruthkosky
*Assistant Examiner* — Julia L Rummel
(74) *Attorney, Agent, or Firm* — Birch, Stewart, Kolasch & Birch, LLP

(57)  ABSTRACT

The present invention relates a coating powder comprising a rare earth oxyfluoride (Ln-O—F) and having: an average particle size ($D_{50}$) of 0.1 to 10 μm, a pore volume of pores having a diameter of 10 μm or smaller of 0.1 to 0.5 cm³/g as measured by mercury intrusion porosimetry, and a ratio of the maximum peak intensity (S0) assigned to a rare earth oxide ($Ln_xO_y$) in the 2θ angle range of from 20° to 40° to the maximum peak intensity (S1) assigned to the rare earth oxyfluoride (Ln-O—F) in the same range, S0/S1, of 1.0 or smaller in powder X-ray diffractometry using Cu-Kα rays or Cu-Kα₁ rays.

14 Claims, 3 Drawing Sheets

(51) Int. Cl.
- *C23C 4/04* (2006.01)
- *C23C 14/06* (2006.01)
- *C23C 14/34* (2006.01)
- *C04B 35/50* (2006.01)
- *C04B 35/515* (2006.01)
- *C04B 35/553* (2006.01)
- *C23C 14/26* (2006.01)
- *C23C 14/35* (2006.01)
- *C23C 24/08* (2006.01)
- *C04B 111/00* (2006.01)

(52) U.S. Cl.
CPC .............. *C04B 35/553* (2013.01); *C23C 4/04* (2013.01); *C23C 4/11* (2016.01); *C23C 14/06* (2013.01); *C23C 14/0694* (2013.01); *C23C 14/26* (2013.01); *C23C 14/3414* (2013.01); *C23C 14/35* (2013.01); *C23C 24/082* (2013.01); *C04B 2111/00482* (2013.01); *C04B 2235/3224* (2013.01); *Y10T 428/29* (2015.01)

(56) References Cited

U.S. PATENT DOCUMENTS

| | | | | |
|---|---|---|---|---|
| 2002/0177014 | A1* | 11/2002 | Kaneyoshi | ................ C23C 4/04 428/702 |
| 2002/0192429 | A1 | 12/2002 | Takai et al. | |
| 2006/0006250 | A1* | 1/2006 | Marshall | .................. B05D 1/12 239/100 |
| 2006/0182969 | A1* | 8/2006 | Kitamura | .................. C23C 4/11 428/402 |
| 2007/0077363 | A1 | 4/2007 | Kitamura et al. | |
| 2014/0057078 | A1 | 2/2014 | Hamaya et al. | |
| 2015/0111037 | A1 | 4/2015 | Fukagawa et al. | |
| 2015/0361540 | A1 | 12/2015 | Hamaya et al. | |

FOREIGN PATENT DOCUMENTS

| | | |
|---|---|---|
| JP | 2014-136835 A | 7/2014 |
| TW | 200426206 A | 12/2004 |
| WO | WO 2014/112171 A1 | 7/2014 |

OTHER PUBLICATIONS

"Yttrium Oxide Y2O3 Yttria target," Cathay Advanced Materials Limited, Accessed on May 24, 2018 at http://www.cathaymaterials.com/sdp/122091/4/pd-1069404/1925831-2801197/Yttrium_Oxide_Y2O3_Yttria_target.html., 2007, pp. 1-3 (4 pages total).

International Search Report for PCT/JP2016/053064 (PCT/ISA/210) dated Apr. 5, 2016.

Machine Translation of JP 4401353 B2 (Japanese counterpart to TW 200426206 A).

* cited by examiner

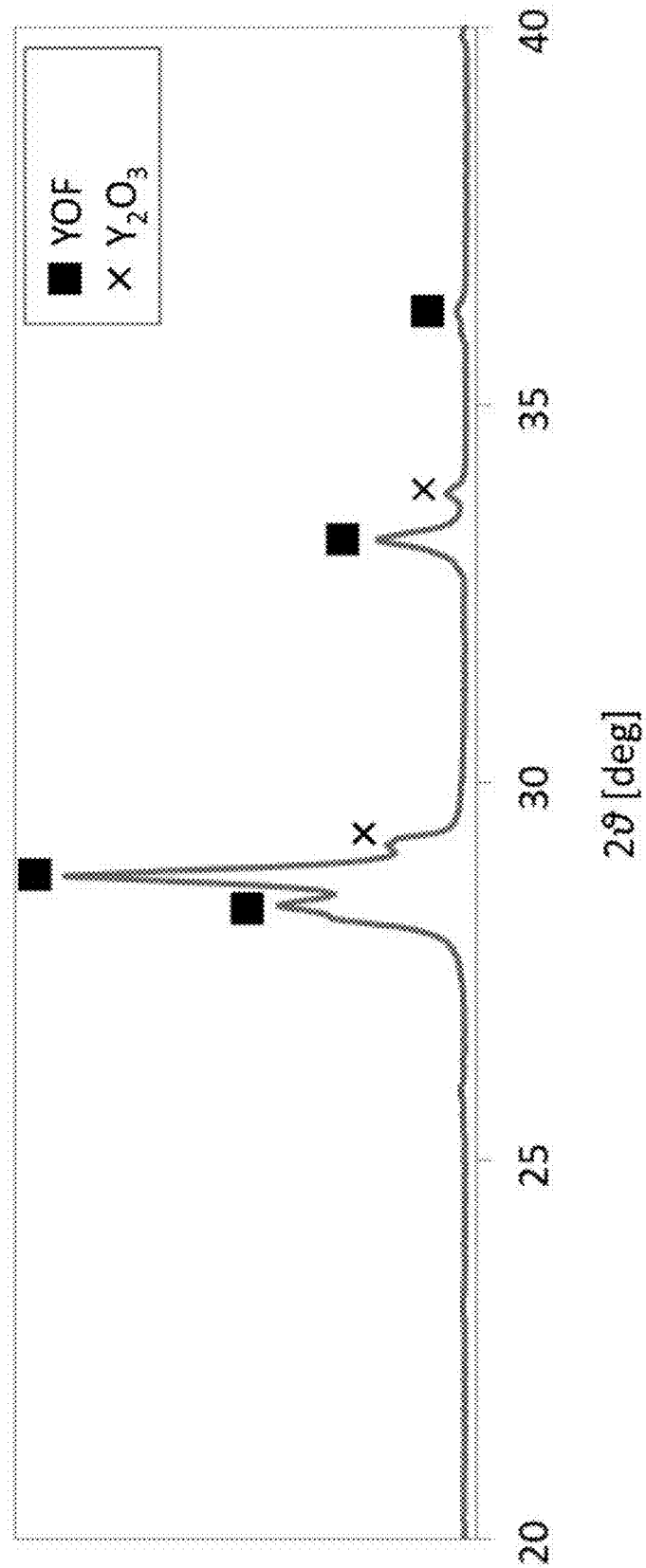

POWDER FOR FILM FORMATION AND MATERIAL FOR FILM FORMATION

CROSS-REFERENCE TO RELATED APPLICATIONS

This application is a Continuation application of co-pending application Ser. No. 15/536,886, filed on Jun. 16, 2017, which is the National Phase under 35 U.S.C. § 371 of International Application No. PCT/JP2016/053064, filed on Feb. 2, 2016, which claims the benefit under 35 U.S.C. § 119(a) to Patent Application No. 2015-024627, filed in Japan on Feb. 10, 2015, and Patent Application No. 2015-184844, filed in Japan on Sep. 18, 2015, all of which are hereby expressly incorporated by reference into the present application.

TECHNICAL FIELD

This invention relates to a coating powder containing a rare earth element and a coating material.

BACKGROUND ART

A halogen gas is used in an etching step in the fabrication of semiconductor devices. In order to prevent halogen gas corrosion of an etching apparatus, the inner side of the etching apparatus is usually coated with a highly anti-corrosive substance by various coating techniques, such as thermal spraying. Materials containing a rare earth element as one type of such substances are often used.

Coating materials containing a rare earth element are usually granulated into flowable granules. To use the coating material in the form of non-granulated powder or slurry containing non-granulated powder has also been under study.

Among known coating materials containing a rare earth element is a thermal spray material comprising a particulate rare earth oxyfluoride having an aspect ratio of 2 or smaller, an average particle size of 10 to 100 µm, and a bulk density of 0.8 to 2 g/cm$^3$ and containing not more than 0.5% by mass of carbon and 3 to 15% by mass of oxygen. It is known that this thermal spray material can be prepared by granulation (see Patent Literature 1).

A rare earth-containing compound particles for thermal spraying, having a polygonal shape with an average particle diameter of 3 to 100 µm, a dispersion index of up to 0.5, and an aspect ratio of up to 2 is also known. The particles are not granulated so that incorporation of impurities, such as iron, is avoided (see Patent Literature 2).

Coating techniques other than thermal spraying are also studied. For example, Patent Literature 3 teaches a method for producing an anti-corrosive part composed of a substrate made of ceramics, quartz, or silicon and an anti-corrosive coating of $Y_2O_3$. According to the method, a $Y_2O_3$ anti-corrosive coating having a thickness of 1 to 100 µm is formed on the substrate by physical vapor deposition (PVD), such as ion plating.

CITATION LIST

Patent Literature

Patent Literature 1: US 2014057078A1
Patent Literature 2: US 2002177014A1
Patent Literature 3: JP 2005-97685A

SUMMARY OF THE INVENTION

Technical Problem

The rare earth oxyfluoride thermal spray material of Patent Literature 1 provides a thermal spray coating exhibiting very good anti-corrosion properties. However, because the thermal spray material is prepared by granulation, the resulting thermal spray coating tends to be less dense.

The rare earth element-containing compound particles for thermal spraying of Patent Literature 2 substantially consist of a rare earth oxide, so that the resulting thermal spray coating, while satisfactory in resistance to corrosion by a fluorine-based plasma, tends to have insufficient resistance to corrosion by a chlorine-based plasma.

The anti-corrosive coating formed by PVD according to Patent Literature 3, which is made of yttrium oxide, exhibits high resistance to corrosion by a fluorine-based plasma but tends to be unsatisfactory against corrosion by a chlorine-based plasma.

An object of the invention is to provide a coating powder that eliminates various disadvantages of the aforementioned conventional techniques and a coating material containing the powder.

Means for Solving the Problem

As a result of extensive studies with a view to solving the above problem, the inventors have surprisingly found that a coating powder containing a rare earth oxyfluoride and having a specific particle size and a specific pore volume measured by mercury intrusion porosimetry provides a very dense and uniform coating having high resistance to corrosion by a chlorine-based plasma, and thus completed the invention.

The present invention has been completed on the basis of the above findings and provide a coating powder including a rare earth oxyfluoride (Ln-O-F) and having: an average particle size ($D_{50}$) of 0.1 to 10 µm; a pore volume of pores having a diameter of 10 µm or smaller of 0.1 to 0.5 cm$^3$/g as measured by mercury intrusion porosimetry; and a ratio of the maximum peak intensity (S0) assigned to a rare earth oxide ($Ln_xO_y$) in the 2θ angle range of from 20° to 40° to the maximum peak intensity (S1) assigned to the rare earth oxyfluoride (Ln-O-F) in the same range, S0/S1, of 1.0 or smaller in powder X-ray diffractometry using Cu-Kα rays or Cu-Kα$_1$ rays.

The invention also provides a coating material comprising the coating powder.

Advantageous Effects of Invention

The coating powder and the coating material according to the invention form a dense and uniform coating having high resistance to corrosion by not only a fluorine-based plasma but a chlorine-based plasma and less prone to particle shedding during plasma etching.

BRIEF DESCRIPTION OF DRAWINGS

FIG. 3 is an X-ray diffraction pattern of the coating powder of Example 15.

DESCRIPTION OF EMBODIMENTS

Figure 1:
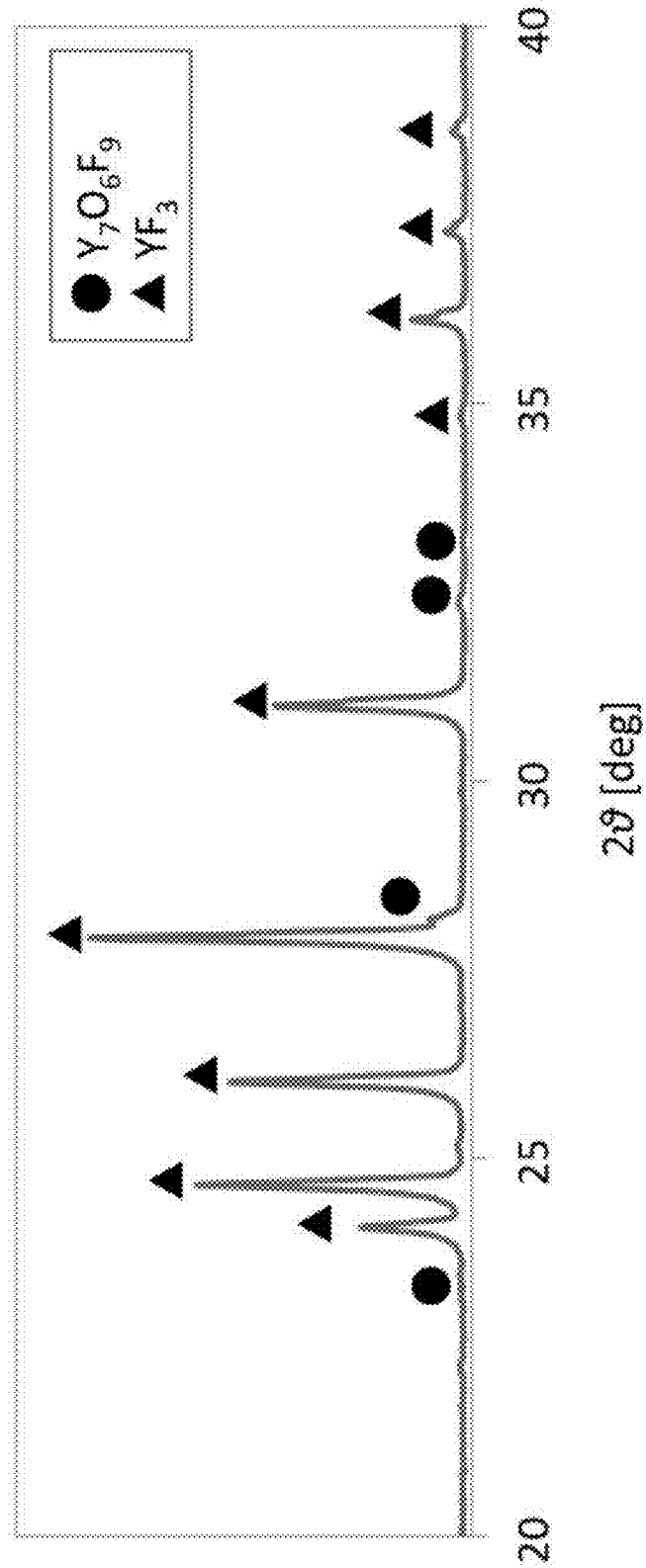
FIG. 1 is an X-ray diffraction pattern of the coating powder of Example 3.

The invention will be described on the basis of preferred embodiments.

I. The coating powder of the invention (hereinafter also referred to as "the powder of the invention") will be described first.

(1) Rare Earth Oxyfluoride

The coating powder of the invention is characterized by containing a rare earth oxyfluoride (hereinafter also referred to as Ln-O—F). The rare earth oxyfluoride (Ln-O—F) of the invention is a compound composed of a rare earth element (Ln), oxygen (O), and fluorine (F). The Ln-O—F includes not only a compound having a molar ratio between a rare earth element (Ln), oxygen (O), and fluorine (F), Ln:O:F, of 1:1:1 but a compound having an Ln:O:F molar ratio other than 1:1:1. For example, when Ln=Y, examples of the Ln-O—F include $Y_5O_4F_7$, $Y_5O_6F_7$, $Y_7O_6F_9$, $Y_4O_6F_9$, $Y_6O_5F_8$, $Y_{17}O_{14}F_{23}$, and $(YO_{0.826}F_{0.17})F_{1.174}$ as well as YOF, and the coating powder of the invention can contain at least one of these oxyfluorides. The Ln-O—F is preferably a compound represented by $LnO_xF_y$ ($0.3 \leq x \leq 1.7$, $0.1 \leq y \leq 1.9$) in view of ease of preparation of the oxyfluoride and for ensured effects of the invention, i.e., denseness, uniformity, and high corrosion resistance of the resulting coating. From the same point of view, x in the above chemical formula is preferably $0.35 \leq x \leq 1.65$, more preferably $0.4 \leq x \leq 1.6$; and y in the formula is preferably $0.2 \leq y \leq 1.8$, more preferably $0.5 \leq y \leq 1.5$. The relation between x and y in the formula is preferably $2.3 \leq 2x+y \leq 5.3$, more preferably $2.35 \leq 2x+y \leq 5.1$, even more preferably $2x+y=3$.

A coating powder having a desired composition of Ln-O—F can be prepared by adjusting the molar ratio of the rare earth fluoride ($LnF_3$) to a rare earth oxide ($Ln^*$) or a rare earth compound that becomes an oxide on firing ($Ln^*$), i.e., $LnF_3/Ln^*$, used in step 1 or the conditions of firing in step 2 of a preferred process of preparation hereinafter described.

Rare earth elements (Ln) include 16 elements: scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). The coating powder of the invention contains at least one of the 16 rare earth elements. To further increase the heat resistance, the wear resistance, and the corrosion resistance of the coating formed by using the coating powder or a coating material containing the powder according to the coating method hereinafter described, it is preferred to use at least one of yttrium (Y), cerium (Ce), samarium (Sm), gadolinium (Gd), dysprosium (Dy), erbium (Er), and ytterbium (Yb), particularly yttrium (Y).

(2) In the Case that Rare Earth Fluoride ($LnF_3$) is Further Contained

The powder of the invention containing Ln-O—F may further contain a rare earth fluoride ($LnF_3$). Taking into consideration ability to form a uniform coating, resistance to corrosion of a coating to oxygen radicals, and the like, it is preferred that the Ln-O—F-containing particles of the powder of the invention be composed solely of Ln-O—F, but the presence of $LnF_3$ is acceptable as long as the effects of the invention are not impaired. The $LnF_3$ content in the Ln-O—F is adjustable by the mixing ratio in step 1 in the hereinafter described process for producing the coating powder of the invention. It is not easy to accurately determine the fluorine content in the powder of the invention. Therefore, in the invention, the content of $LnF_3$ is estimated from the relative intensity of the main peak assigned to $LnF_3$ with respect to the main peak assigned to Ln-O—F in X-ray diffractometry of the particles of the powder of the invention. In detail, the particles are analyzed by X-ray diffractometry using CuKα or Cu-Kα$_1$ rays, and a ratio of the maximum peak intensity (S1) assigned to Ln-O—F in the 2θ angle range of from 20° to 40° to the maximum peak intensity (S2) assigned to $LnF_3$ in the same range, S1/S2, is obtained. For example, when the ratio, S1/S2, is 0.01 or greater, the resulting coating tends to be denser and more uniform and be prevented from generating dust particles (particle shedding) in plasma etching more effectively. From this viewpoint, the S1/S2 is more preferably 0.02 or greater.

(3) Rare Earth Oxide

While the powder of the invention may contain $LnF_3$ in addition to Ln-O—F as discussed above, it is preferred for the powder not to contain, or as little as possible, $Ln_xO_y$, which is an oxide of a rare earth element alone, in view of anti-corrosion properties, particularly resistance to a chlorine-containing gas, of the coating. The $Ln_xO_y$ content in the coating powder of the invention can be minimized by, for example, selecting properly the mixing ratio in step 1 and the firing conditions in step 2 in the hereinafter described process for producing the coating powder.

Because it is not easy to quantitatively determine the $Ln_xO_y$ content in the coating powder of the invention by chemical analyses, the $Ln_xO_y$ content is estimated from the intensity of peaks in X-ray diffractometry of the coating powder in the invention. In detail, the coating powder of the invention is analyzed by X-ray diffractometry using Cu-Kα rays or Cu-Kα$_1$ rays, and a ratio of the maximum peak intensity (S0) assigned to a rare earth oxide in the 2θ angle range of from 20° to 40° to the maximum peak intensity (S1) assigned to a rare earth oxyfluoride in the same range, S0/S1, is obtained. X-ray diffractometry adopted in the invention is powder X-ray diffractometry.

It is required, in the invention, that the S0/S1 be 1.0 or smaller. The S0/S1 is preferably 0.20 or smaller, more preferably 0.10 or smaller, even more preferably 0.05 or smaller. The smaller the S0/S1, the better. The S0/S1 is most preferably 0. With the S0/S1 being as small as 1.0 or less, the coating is highly resistant to not only corrosion by a fluorine-based plasma but corrosion by a chlorine-based plasma.

In powder X-ray diffractometry, the maximum diffraction peaks assigned to a rare earth oxyfluoride (Ln-O—F), a rare earth oxide ($Ln_xO_y$), and a rare earth fluoride ($LnF_3$) usually appear at a 2θ angle ranging from 20° to 40°. For example, the maximum diffraction peak assigned to yttrium oxide ($Y_2O_3$) appears at a 2θ angle of around 29.10.

In saying that the S0/S1 should be in the range described above in X-ray diffractometry using Cu-Kα or Cu-Kα$_1$ rays, it is only necessary that the requirement be satisfied in X-ray diffractometry using either Cu-Kα rays or Cu-Kα$_1$ rays. It does not mean that the S0/S1 should be in that range in both X-ray diffractometry using Cu-Kα rays and X-ray diffractometry using Cu-Kα$_1$ rays (the same applies to the S1/S2). Note that, however, because both the values S0/S1 and S1/S2 do not substantially vary depending on which of Cu-Kα rays and Cu-Kα$_1$ rays are used, it does not matter which X-rays are used unless these values are extremely close to the boundary values of the above ranges. X-ray diffractometry for obtaining S0, S1, and S2 is carried out under the conditions described in Examples given later.

In general, a rare earth oxide ($Ln_xO_y$), when produced by firing an oxalate or a carbonate in the air, is a sesquioxide $Ln_2O_3$ (x=2 and y=3), except for cerium (Ce), praseodymium (Pr), terbium (Tb). A cerium oxide is usually obtained as $CeO_2$ (x=1 and y=2), a praseodymium oxide is usually obtained as $Pr_6O_{11}$ (x=6 and y=11), and a terbium oxide is usually obtained as $Tb_4O_7$ (x=4 and y=7). Oxides of other forms, such as $Ce_2O_3$, $Pr_2O_3$, $PrO_2$, and EuO, could be produced under specific conditions but are converted to the above described usual forms when allowed to stand in the air. Therefore, the above described usual oxide forms are preferred.

(4) Average Particle Size ($D_{50}$) of Powder

The Ln-O—F-containing particles in the coating powder of the invention have an average particle size of 0.1 to 10 μm. Having an average particle size of 0.1 μm or greater, the powder is capable of forming a dense and uniform coating. Having an average particle size of 10 μm or smaller, the powder is capable of forming a coating dense and less prone to cracking. From these viewpoints, the average particle size of the Ln-O—F-containing powder is preferably 0.2 to 8 μm, more preferably 0.5 to 6 μm. As used herein, the term "average particle size" is a diameter at 50% cumulative volume in the particle size distribution (hereinafter also simply referred to as $D_{50}$).

$D_{50}$ can be determined by laser diffraction/scattering particle size distribution analysis. Details of the $D_{50}$ measurement will be described later. In carrying out laser diffraction/scattering particle size distribution analysis for the measurement of $D_{50}$, the powder is previously subjected to ultrasonic dispersion treatment at an ultrasonic power of 300 W for 5 minutes (this also applies to the measurement of $D_{90}$ and $D_{10}$ hereinafter described). Powder whose average particle size is in the range recited can be obtained by properly selecting the grinding conditions in step 3 of the hereinafter described process for producing the coating powder of the invention.

(5) Dispersion Index

It is preferred for the coating powder of the invention to have a dispersion index of 0.7 or smaller as well as the above discussed specific $D_{50}$. The dispersion index is defined to be $[(D_{90}-D_{10})/(D_{90}+D_{10})]$, wherein $D_{90}$ and $D_{10}$ are diameters at 90% and 10% cumulative volumes, respectively, counted from the smallest side in the laser diffraction/scattering particle size distribution. To have a dispersion index of 0.7 or smaller is preferred in the interests of obtaining a denser coating that is less prone to particle shedding in plasma etching. From the same viewpoint, the dispersion index is preferably 0.6 or smaller, even more preferably 0.5 or smaller. Although a dispersion index closer to zero is more preferred, the dispersion index is preferably 0.15 or greater, more preferably or greater, even more preferably 0.2 or greater, in view of ease of preparation. Powder of which the dispersion index falls within the above range can be prepared by carrying out the grinding in step 3 in the hereinafter described process of preparation by at least wet grinding or in two or more stages.

(6) Volume of Pores Having a Diameter of 10 μm or Smaller Measured by Mercury Intrusion Porosimetry The coating powder of the invention is also characterized by having a specific volume of pores of 10 μm or smaller diameter as measured by mercury intrusion porosimetry (hereinafter also simply referred to as the pore volume). The pore volume is a volume of spaces between particles of the coating powder with a given pressure applied thereon. The inventors have extensively investigated into the relation between the physical properties of the powder containing a rare earth oxyfluoride and the density of a coating obtained therefrom and found, as a result, that the pore volume is an important factor for obtaining a dense coating. The pore volume depends on not only the particle size and specific surface area of the coating powder but also the shape and the like of particles constituting the coating powder. Therefore, powders having the same particle size and the same BET specific surface area do not always have the same pore volume. Specifically, it is important for the coating powder of the invention to have a pore volume of pores having a diameter of 10 μm or smaller of 0.1 to 0.5 cm$^3$/g. The inventors have proved that a coating powder having the pore volume in that range can provide a coating which is dense and highly resistant to corrosion by a halogen plasma. To ensure the denseness of the resulting coating, the pore volume of the coating powder of the invention is preferably 0.12 to 0.48 cm$^3$/g, more preferably 0.15 to 0.45 cm$^3$/g.

(7) Peak of Pore Size Distribution (Abscissa: Pore Size; Ordinate: Log Differential Pore Volume)

In order to further enhance the effects of the invention, it is preferred that the pore size distribution of the coating powder of the invention as measured by mercury intrusion porosimetry (pore size plotted as abscissa, and log differential pore volume as ordinate) show a peak in a specific range. Specifically, the coating powder of the invention preferably shows a peak in the range of from 0.1 μm to 5 μm in the pore size distribution measured by mercury intrusion porosimetry. The coating powder of the invention which shows a pore size peak in that range forms a coating that is less porous and therefore denser and less liable to cracking on cooling. To further enhance these effects, the pore size peak is preferably observed within a range of from 0.3 to 4 μm, more preferably from 0.5 to 3 μm. The results of mercury intrusion porosimetry are usually plotted with the pore size as abscissa and the log differential pore volume as the ordinate. In the invention, too, the results are plotted in that way, and the peak position is obtained from the plots.

(8) Adjustment of Pore Volume and Pore Size Peak

The pore volume and pore size peak can be adjusted to fall within the respective ranges discussed above by properly selecting various conditions in steps 1 to 3 in the hereinafter described process for preparing the coating powder of the invention, particularly the average particle size ($D_{50}$) of a rare earth oxide or a rare earth compound capable of becoming an oxide on firing and that of a rare earth fluoride that are to be mixed in step 1, the firing conditions in step 2, and the wet grinding conditions in step 3. The pore volume and the pore size peak can be determined by the methods described in Examples hereinafter given.

(9) BET Specific Surface Area

The coating powder of the invention has a BET specific surface area within a specific range. Specifically, the BET specific surface area of the coating powder of the invention ranges from 1 to 10 m$^2$/g. When the coating powder of the invention is used for forming a coating, the powder containing the rare earth oxyfluoride moderately melts or vaporizes due to the BET specific surface area in that range thereby to form a dense coating. To obtain a denser coating, the BET specific surface area of the coating powder is preferably 1.2 to 9 m$^2$/g, more preferably 1.5 to 8 m$^2$/g. Coating powder whose BET specific surface area is in that range can be obtained by properly selecting the firing temperature in step 2 of the hereinafter described process for preparation. The BET specific surface area can be determined by the method described in Examples given infra.

(10) O/Ln Molar Ratio

The coating powder of the invention preferably has a molar ratio of oxygen element (O) to rare earth element (Ln) per kg, an O/Ln molar ratio, of 0.03 to 1.1. With the O/Ln molar ratio being in that range, the resulting coating exhibits further improved resistance to corrosion by a chlorine-based plasma, and the coating tends to be denser, more uniform, and less liable to particle shedding during plasma etching. To ensure these effects, the O/Ln molar ratio is more preferably 0.04 to 1.08, even more preferably 0.05 to 1.05.

Examples of typical compositions of coating powders identified by X-ray diffractometry include: a composition containing $LnF_3$ and $Ln_7O_6F_9$ when $0 \leq O/Ln \leq 0.6$; a composition containing $Ln_5O_4F_7$ when $0.6 < O/Ln \leq 0.83$; a composition containing $Ln_7O_6F_9$ when $0.83 < O/Ln \leq 0.95$; a composition containing LnOF when $0.95 < O/Ln \leq 1.05$; and a composition containing LnOF and $Ln_2O_3$ when $1.05 < O/Ln \leq 1.45$. The above examples of the compositions of coating powders are for illustrative purposes only but not for limitation.

The O/Ln molar ratio is calculated from the oxygen content of the coating powder measured by inert gas fusion-IR absorption spectrometry and the rare earth content of the powder measured by acid digestion/ICP-AES. The O/Ln molar ratio can be adjusted to be in the above range by properly selecting the $LnF_3/Ln^*$ molar ratio in step 1, the firing conditions in step 2, and so on in the hereinafter described preferred process for preparation.

(11) Aspect Ratio

The coating powder of the invention preferably has an aspect ratio of 1.0 to 5.0 in view of capability of forming a dense and uniform coating. From this viewpoint, the aspect ratio is more preferably 1.0 to 4.0, even more preferably 1.0 to 3.0. The aspect ratio can be determined by the method described in the Examples below. Powder having the above aspect ratio can be obtained by adjusting the size of the grinding medium or the grinding time or by the use of a grinding machine capable of applying a high energy in step 3 described below.

II. The Coating Material According to the Invention Will Next be Described.

The coating material of the invention contains the coating powder of the invention. As stated earlier, the coating powder of the invention can be mixed or shaped with other components to provide a coating material that is fed to a coating apparatus more easily.

(1) Coating Material in the Form of Slurry

The coating material of the invention preferably has the form of slurry for obtaining a dense coating. The coating material in the form of slurry will also be called a coating slurry. In the case where the coating material of the invention has the form of slurry, the $D_{50}$, $D_{90}$, $D_{10}$, and dispersion index of the powder particles may be determined as they are suspended in the form of slurry, but the BET specific surface area, pore volume, pore size peak, aspect ratio, and fluorine concentration (described later) of the powder particles are measured after the slurry is thoroughly dried at 110° C.

The dispersion medium of the coating slurry may be one of, or a combination of two or more of, water and various organic solvents. An organic solvent having a water solubility of 5 mass % or more or a mixture of such an organic solvent and water is preferred in terms of forming a denser and more uniform coating. The organic solvent with a water solubility of 5 mass % or more may be a freely water-miscible organic solvent. The mixture of the organic solvent having a water solubility of 5 mass % or more and water preferably has an organic solvent to water ratio within the water solubility limit of the organic solvent. In view of the dispersibility of the particles containing a rare earth oxide, the proportion of the organic solvent having a water solubility of 5 mass % or more in the dispersion medium is preferably 5 mass % or more, more preferably 10 mass % or more, even more preferably 12 mass % or more.

Examples of the organic solvent having a water solubility of 5 mass % or more (including a freely water-miscible one) include alcohols, ketones, cyclic ethers, formamides, and sulfoxides.

Examples of the alcohols include monohydric alcohols, such as methanol (methyl alcohol), ethanol (ethyl alcohol), 1-propanol (n-propyl alcohol), 2-propanol (isopropyl alcohol, IPA), 2-methyl-1-propanol (isobutyl alcohol), 2-methyl-2-propanol (tert-butyl alcohol), 1-butanol (n-butyl alcohol), and 2-butanol (sec-butyl alcohol); and polyhydric alcohols, such as 1,2-ethanediol (ethylene glycol), 1,2-propanediol (propylene glycol), 1,3-propanediol (trimethylene glycol), and 1,2,3-propanetriol (glycerol).

Examples of ketones for use in the invention are propanone (acetone) and 2-butanone (methyl ethyl ketone, MEK). Examples of the cyclic ethers are tetrahydrofuran (THF) and 1,4-dioxane. Examples of the formamides include N,N-dimethylformamide (DMF). Examples of the sulfoxides include dimethyl sulfoxide (DMSO). These organic solvents may be used either individually or as a mixture thereof.

Preferred of the organic solvents having a water solubility of 5 mass % or more are alcohols. Monohydric alcohols are more preferred, with at least one of methanol, ethanol, 1-propanol and 2-propanol being particularly preferred.

In using a water/ethanol mixture as a dispersion medium, the ethanol concentration is preferably not more than 24 vol % (not more than 20 mass %) so as to be excluded from the list of dangerous goods based on United Nations Recommendations on Transport.

The concentration of the coating powder in the coating slurry is preferably 10 to 50 mass %, more preferably 12 to 45 mass %, even more preferably 15 to 40 mass %. With the powder concentration being in that range, the formation of a coating from the slurry can be achieved in a relatively short time with good coating efficiency, and the resulting coating exhibits good uniformity.

The coating material in the form of slurry preferably has a viscosity of 100 cP (mPa·s) or less at 25° C. so that it may be fed stably in thermal spraying to form a uniform coating. From that viewpoint, the viscosity is more preferably 70 cP (mPa·s) or less, even more preferably 50 cP (mPa·s) or less. The lower limit of the viscosity of the coating slurry at 25° C. is not particularly limited but, in view of ease of preparation, is preferably 0.5 cP or more, more preferably 1.0 cP (mPa·s) or more, even more preferably 1.5 cP (mPa·s) or more. The coating slurry whose viscosity is in that range may be obtained by properly selecting the amount of the rare earth oxyfluoride particles to be used, the type of the dispersion medium, and the like. The viscosity can be measured by the method described in Examples below.

The coating slurry may contain components other than the rare earth oxyfluoride-containing powder and the dispersion medium, such as pH adjustors, dispersants, viscosity modifiers, and bactericides, as long as the effect of the invention is not impaired. The solid matter of the coating slurry may comprise particles other than the rare earth oxyfluoride-containing powder but is preferably composed solely of the rare earth oxyfluoride-containing powder in terms of forming a dense and uniform coating.

(2) Coating Material in the Form of Sintered Compact

The coating material of the invention may include sintered compact, which is also preferred for obtaining a dense coating. The coating material in the form of sintered compact is obtained by firing the coating powder of the invention. A coating material comprising a sintered compact of the coating powder of the invention will also be called a coating material in the form of sintered compact. The coating material in the form of sintered compact preferably has the same composition as the coating powder of the invention. Accordingly, the above described preference with respect to the ranges of S0/S1, S 1/S2, and O/Ln molar ratio of the coating powder equally applies to the powder obtained by grinding the coating material in the form of sintered compact. When the fluorine concentration of the powder obtained by grinding the coating material in the form of sintered compact is determined by the method described below, a preferred range of the fluorine concentration is the same as that of the coating powder of the invention as determined by the same method.

III. Method for Forming Coating

Coating methods that can be used to form a coating using the coating powder or coating material of the invention will be described.

Coating methods applicable to the invention include thermal spraying, aerosol deposition (AD), and physical vapor deposition (PVD).

(1) Thermal Spraying

Thermal spray techniques that can be applied to the coating powder of the invention and the coating material in the form of slurry include flame spraying, high velocity flame spraying (also called high velocity oxygen fuel spraying), detonation spraying, laser thermal spraying, plasma thermal spraying, and laser plasma hybrid spraying.

The reason why the coating powder of the invention and the coating material containing the powder form a dense and uniform thermal spray coating is believed to be because the coating powder of the invention and the coating material containing the powder are readily fused uniformly when sprayed.

(2) Aerosol Deposition (AD)

The coating powder of the invention is also used in the AD process. The reason why the coating powder of the invention forms a dense and uniform coating by the AD process is considered to be because the coating powder of the invention is readily aerosolized uniformly in the AD process.

The AD process is a technique in which an aerosol obtained by mixing the coating powder and a carrier gas at room temperature is jetted from a nozzle at a high velocity and made to collide with a substrate to form a coating film on the substrate. Because the coating powder used in the AD process is especially required to achieve more uniform and denser film formation, it is required to be microfine and uniform in shape, being free from acicular or irregularly shaped particles.

Specifically, it is preferred for the coating powder of the invention for use in the AD process to have an average particle size ($D_{50}$) of 0.2 to 5 μm, more preferably 0.5 to 2 μm, a dispersion index of 0.7 or smaller, more preferably 0.5 or smaller, and an aspect ratio of 1.0 to 3.0, more preferably 1.0 to 2.0.

(3) Physical Vapor Deposition (PVD)

PVD is largely classified into sputtering, vacuum evaporation, and ion plating (see Patent Map: Chemistry 16: Physical Vapor Deposition, FIG. 4.1.1-3, available on the JPO website).

The coating powder of the invention can be used in vacuum evaporation and ion plating. Vacuum evaporation is a process in which a coating material is evaporated or sublimated in vacuo, and the vapor of the material reaches and deposits on a substrate to form a coating. Electron beam or laser evaporation processes are preferred because a sufficiently large amount of energy for vaporizing the powder containing the rare earth oxyfluoride is provided. The ion plating process is based on almost the same principle as vacuum evaporation, with the difference being that the evaporant is passed through a plasma to be positively charged, and is attracted to a negatively charged substrate, and deposited on the substrate to form a coating layer.

The coating material in the form of sintered compact can be used in vacuum evaporation, sputtering, and ion plating. Sputtering is a process in which high-energy particles in a plasma, etc. are bombarded against a target material to eject particles from the target, and the ejected particles of the target deposit on a substrate to form a coating layer.

In the case of the ion plating process, in particular, in order to enable the application to substrates in various shapes, the coating powder desirably has a composition with a minimized fluoride content whether it is used as such or in the form of sintered compact.

It is preferred for the powder to have a small fluorine concentration, specifically not more than 30 mass %, more preferably not more than 25 mass %. While there is no particular lower limit to the fluorine concentration, a fluorine concentration of 5 mass % or more is preferred so as to give a sufficient oxyfluoride content. The fluorine concentration can be determined by the method described in the Examples. The coating powder having the fluorine concentration adjusted within the above range can be obtained by properly selecting the mixing ratio between the rare earth oxide ($Ln_xO_y$) or a rare earth compound capable becoming an oxide on firing and a rare earth fluoride ($LnF_3$) in step 1, the conditions of firing in step 2 of a preferred process of preparation described below, and the like.

The reason why the coating powder of the invention or the coating material in the form of sintered compact provides a dense and uniform coating when used to form a coating by the PVD processes is considered to be because they vaporizes uniformly in the PVD processes.

IV. Process of Preparation (1) Process for Preparing Coating Powder

A suitable process for preparing the coating powder of the invention will then be described. The process includes the following three essential steps and, as the case may be, an additional step, which will be described in sequence.

Step 1: mixing a rare earth oxide ($Ln_xO_y$) or a rare earth compound capable of becoming an oxide on firing and a rare earth fluoride ($LnF_3$) to prepare a mixture.

Step 2: firing the mixture obtained in step 1 to form a rare earth oxyfluoride.

Step 3: grinding the fired product obtained in step 2.

Additional step (when the grinding of step 3 is wet grinding): drying the resulting wet-ground product to give a dry product.

Step 1:

The rare earth oxide ($Ln_xO_y$) or a rare earth compound capable of becoming an oxide on firing to be subjected to mixing preferably have an average particle size ($D_{50}$) of 0.1 to 10 μm, more preferably 0.15 to 8 μm, even more preferably 0.2 to 7 μm.

The rare earth fluoride ($LnF_3$) to be subjected to mixing preferably has an average particle size ($D_{50}$) of greater than 5 μm and not greater than 500 μm, more preferably greater than 5 μm and not greater than 100 μm, even more preferably 5.5 to 50 μm. Measurements of $D_{50}$ of these components are taken after ultrasonication, and specifically, taken in the same manner as described above with respect to the $D_{50}$ of the coating powder.

When the average particle sizes ($D_{50}$) of the rare earth oxide ($Ln_xO_y$) or the rare earth compound capable of becoming an oxide on firing and the rare earth fluoride ($LnF_3$) are in their respective preferred ranges, the grinding labor will be saved particularly in grinding the rare earth fluoride that needs much labor to grind while securing the reactivity in the firing of step 2, and it is easier to control the pore volume and the peak of the pore size distribution of the finally obtained coating powder within the respective preferred ranges described above. Examples of the compound capable of becoming an oxide on firing include an oxalate and a carbonate of a rare earth element.

The mixing ratio is preferably such that the molar ratio of the rare earth fluoride ($LnF_3$) to a rare earth oxide ($Ln^*$) or a rare earth compound that becomes an oxide on firing ($Ln^*$), i.e., $LnF_3/Ln^*$ molar ratio, is 0.4 to 55, more preferably 0.42 to 40, even more preferably 0.45 to 30.

Step 2:

The mixture obtained in step 1 is fired preferably at a temperature of 750° to 1400° C. When fired at a temperature within that range, the mixture sufficiently produces an oxyfluoride of the rare earth element. Although the rare earth fluoride or a small amount of the rare earth oxide may remain, the reaction may have been insufficient if both the rare earth fluoride and the rare earth oxide remain.

The firing temperature is more preferably 800° to 1300° C., even more preferably 850° to 1200° C.

The firing time is preferably 1 to 72 hours, more preferably 2 to 60 hours, even more preferably 3 to 48 hours, provided that the firing temperature is in the range recited above. Within these firing time ranges, a rare earth oxyfluoride is sufficiently produced while holding down the energy consumption.

The firing may be carried out in an oxygen-containing atmosphere, such as the air. However, when the firing temperature is 1100° C. or higher, particularly 1200° C. or higher, an inert gas atmosphere, such as argon gas, or a vacuum atmosphere is preferred, because the rare earth oxyfluoride once formed is liable to decompose to a rare earth oxide in an oxygen-containing atmosphere.

It is not impossible to obtain a product equal to that obtained in step 2 by firing only the rare earth fluoride. However, in the cases where an O/Ln molar ratio of, e.g., 0.5 or higher is desired, the firing must be at high temperatures, the resulting product tends to have a small pore volume, and it would be difficult to obtain a final product falling within the scope of the invention.

Step 3:

The grinding operation may be carried out by any of dry grinding, wet grinding, and a combination of dry grinding and wet grinding. In order to produce a coating powder having a dispersion index of 0.7 or smaller, it is preferred to perform at least wet grinding. Dry grinding may be carried out using a dry ball mill, a dry bead mill, a high-speed rotor impact mill, a jet mill, a grindstone type grinder, a roll mill, or so forth. Wet grinding is preferably carried out in a wet grinding machine using a spherical, cylindrical, or other shaped grinding medium, such as a ball mill, a vibration mill, a bead mill, or Attritor®. The grinding is conducted so as to give ground particles having a $D_{50}$ of 0.1 to 10 µm, preferably 0.2 to 8 µm, more preferably 0.5 to 6 µm. The $D_{50}$ of the ground particles can be controlled by adjusting the size of the grinding medium used, the grinding time, the number of times of passages, and the like. Materials of the grinding media include zirconia, alumina, silicon nitride, silicon carbide, tungsten carbide, wear resistant steel, and stainless steel. Zirconia may be metal oxide-stabilized zirconia. The dispersion medium used in wet grinding may be selected from those described as the dispersion medium of the coating material in the form of slurry. The dispersion medium used in step 3 and that of the slurry obtained in step 3 may be the same or different.

When a coating powder having a dispersion index of 0.6 or smaller, particularly 0.5 or smaller is desired, it is preferred to conduct the grinding by dry grinding followed by wet grinding or to conduct wet grinding in two or more stages, i.e., a plurality of stages. When the grinding is conducted in a plurality of states, it is preferred that the grinding media used in the second and subsequent stages be smaller in size than those used in the preceding stage. The number of the grinding stages is preferably greater, in view of obtaining a powder having the smaller dispersion index. In view of cost and labor, however, two-stage grinding is the most preferred.

In the cases where the grinding is carried out by only dry grinding, the ground product as obtained in step 3 is supplied as the coating powder of the invention.

Additional Step:

When the grinding operation of step 3 involves wet grinding, it is necessary to dry the slurry after the wet grinding to obtain the coating powder of the invention. When the slurry after the wet grinding is dried to obtain a powder, the dispersion medium of the slurry to be dried may be water. However, it is preferred to exchange water with an organic solvent before drying because the powder obtained from a slurry having an organic solvent as a dispersion medium is less liable to agglomerate. Examples of suitable organic solvents include alcohols, such as methanol, ethanol, 1-propanol, and 2-propanol, and acetone. The drying temperature is preferably 80° to 200° C.

The dried product may be lightly disintegrated in dry mode.

The coating powder of the invention is thus obtained.

(2) Process for Preparing Coating Material

The coating material in the form of slurry is obtained through, for example, the following two routes: (1) the coating powder of the invention is mixed with a dispersion medium and (2) the slurry obtained by wet grinding in step 3 above is used as such without drying. In the case of (1), the coating powder to be mixed with a dispersion medium may be lightly disintegrated.

The coating material in the form of sintered compact is prepared through, for example, the following two methods: (a) the coating powder, either as such or, where needed, after being mixed with, e.g., an organic binder, such as PVC (polyvinyl alcohol), an acrylic resin, or methyl cellulose, and/or water, is shaped by pressing and sintered by firing and (b) the coating powder is sintered by firing while a pressure is applied thereto using, for example, a hot press (HP). While it is the most preferred not to add an organic binder to the powder to be fired, the amount of the organic binder to be added, if used, is preferably 5 mass % or less, more preferably 2 mass % or less. In method (a), the pressing of the powder is achieved by, for example, die pressing, rubber pressing (cold isostatic pressing), sheet forming, extrusion, or slip casting. The pressure applied in these pressing processes is preferably 30 to 500 MPa, more preferably 50 to 300 MPa. In method (b), the pressure sintering is achieved by, for example, hot press sintering, pulse current pressure sintering (SPS), or hot isostatic pressing (HIP) sintering. The pressure applied in these pressing processes is preferably 30 to 500 MPa, more preferably 50 to 300 MPa. In methods (a) and (b), the firing temperature is preferably 1000 to 1800° C., more preferably 1100° to 1700° C. The firing is preferably conducted in an inert gas (e.g., argon) atmosphere so as to prevent the rare earth oxyfluoride from decomposing to a rare earth oxide. Before use as a coating material, the resulting sintered compact may be subjected to machining, such as polishing using, e.g., a fixed abrasive polisher, a silicon carbide slurry, or a diamond slurry, or cutting to a prescribed size using, e.g., a lathe.

The thus obtained coating material, including the coating powder, is suitably used in the aforementioned various coating techniques. Examples of substrates to be coated include metals such as aluminum, metal alloys such as aluminum alloys, ceramics such as alumina, and quartz.

EXAMPLES

The invention will now be illustrated in greater detail by way of Examples, but it should be understood that the invention is not deemed to be limited thereto. Unless otherwise noted, all the percents are given by mass. The preparation conditions of Examples 1 through 49 and Comparative Examples 1 through 10 are summarized in Tables 1 and 1A below.

Examples 1 to 15 and Comparative Examples 1 and 2

A coating powder was prepared in accordance with steps (i) to (iv) below.
(i) Step 1: mixing Yttrium oxide ($Y_2O_3$) fine powder available from Nippon Yttrium Co., Ltd. ($D_{50}$: 0.24 μm) and yttrium fluoride ($YF_3$) from Nippon Yttrium Co., Ltd. ($D_{50}$: 7.4 μm) were mixed at an $LnF_3/Ln^*$ molar ratio shown in Table1.
(ii) Step 2: Firing The mixture obtained in step 1 was put in an alumina boat and fired in an electric oven in the atmosphere at 950° C. for 8 hours.
(iii) Step 3: Grinding The fired product obtained in step 2 was dry ground in an atomizer (indicated by "A" in Table 1), mixed with an equal mass of pure water, and wet ground first in a bead mill using 2 mm-diameter yttria-stabilized zirconia (YSZ) balls for 2 hours and then in a bead mill using 1.2 mm-diameter YSZ balls for 0.5 hours to make a slurry.
(iv) Additional Step: Drying The slurry obtained in step 3 was dried at 120° C. for 12 hours to obtain a coating powder of the invention.

The particle size distribution of the resulting coating powder was analyzed to determine $D_{50}$, $D_{90}$, $D_{10}$, and dispersion index by the method below.

The resulting coating powder was further analyzed for BET specific surface area by the method below. The pore size distribution of the coating powder was determined to calculate the pore volume by the method below.

Figure 2:
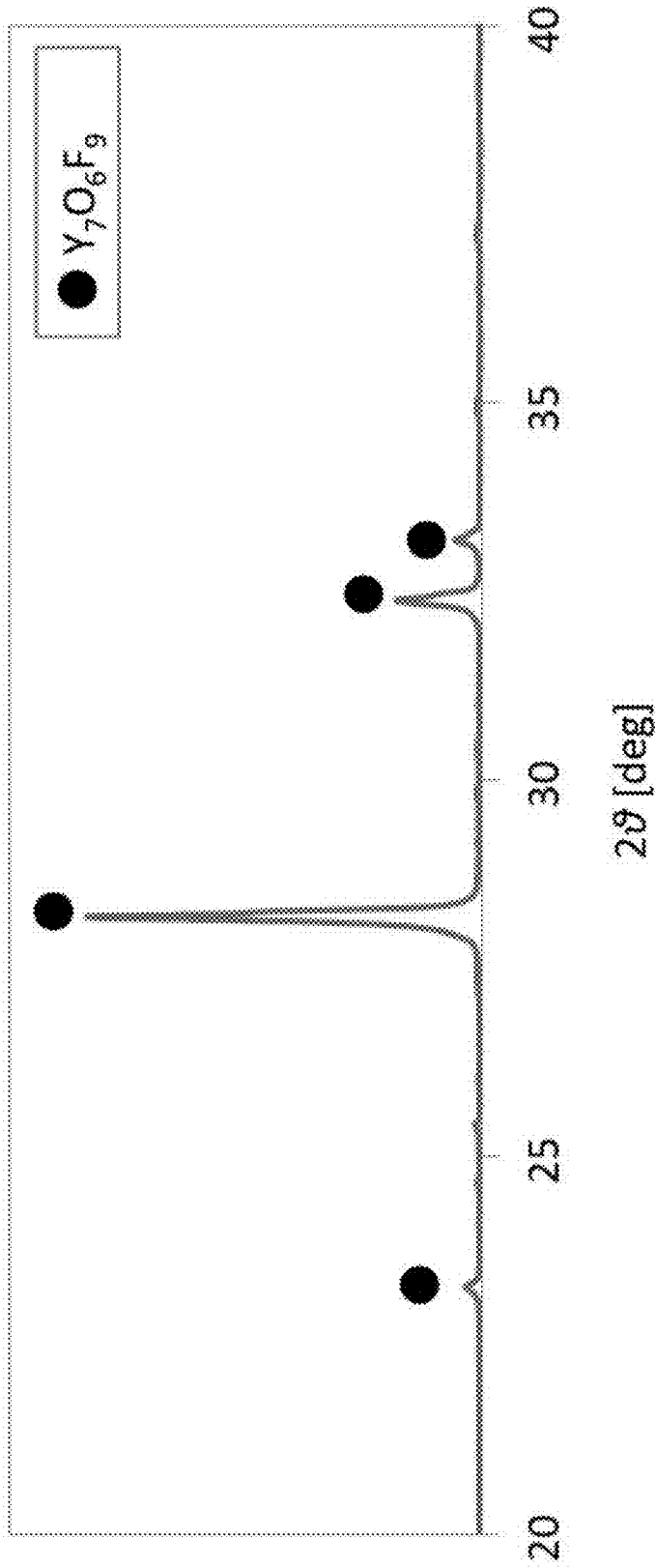
FIG. 2 is an X-ray diffraction pattern of the coating powder of Example 10.

The coating powder was analyzed by powder X-ray diffractometry under the conditions below to obtain the maximum peak intensities (cps) of $LnF_3$, Ln-O—F, and $Ln_xO_y$. The intensities were expressed relatively taking the highest intensity as 100. The compound to which the observed maximum diffraction peak of Ln-O—F was assigned in the X-ray diffractometry is shown in Table 2B, and the maximum diffraction peak assigned to $Ln_xO_y$, when observed, corresponded to that of the rare earth oxide of the above discussed ordinary form (these apply equally to Examples 16 to 49 and Comparative Examples 1 to 10; and the compound to which the observed maximum diffraction peak of Ln-O—F was assigned in Examples 26 to 49 and Comparative Examples 7 to 10 is shown in Table 2C). As is understood from the above description, the ordinary form of the oxide of, for example, yttrium is $Y_2O_3$. The X-ray diffraction patterns of the coating powders obtained in Examples 3, 10, and 15 are shown in FIGS. 1 to 3, respectively.

The oxygen content and the rare earth content of the resulting coating powder were determined by the methods below to obtain the O/Ln molar ratio. The aspect ratio of the coating powder was measured by the method below.
[Method of X-Ray Diffractometry]
Apparatus: Ultima IV (from Rigaku Corp.)
Source: CuKα rays
Tube voltage: 40 kV
Tube current: 40 mA
Scanning speed: 2°/min
Step size: 0.02°
Measurement range: 2θ=20° to 40°
[Method of Measurement of $D_{50}$, $D_{90}$, $D_{10}$, and Dispersion Index]

In a 100 ml glass beaker was put about 0.4 g of the coating powder, and pure water was added thereto as a dispersion medium to the scale of 100 ml. The beaker containing the particles and dispersion medium was set on an ultrasonic homogenizer US-300T (output power: 300 W) available from Nihonseiki Kaisha Ltd. and ultrasonicated for 5 minutes to prepare a slurry to be analyzed. The slurry was dropped into the pure water-containing chamber of the sample circulator of Microtrac 3300EXII from Nikkiso Co., Ltd. until the instrument judged the concentration to be adequate, and $D_{50}$, $D_{90}$, and $D_{10}$ were determined. The dispersion index was calculated from the measured $D_{10}$ and $D_{90}$ values from formula: dispersion index=$(D_{90}-D_{10})/(D_{90}+D_{10})$.
[Method of Measurement of BET Specific Surface Area]

The BET specific surface area was determined using an automatic surface area analyzer Macsorb model-1201 from Mountech Co., Ltd. according to the single point BET method. A nitrogen-helium mixed gas ($N_2$: 30 vol %) was used for the measurement.
[Method of Measurement of Pore Volume and Pore Size Peak]

AutoPore IV from Micromeritics was used. A pore size range of from 0.001 to 100 μm was covered. The cumulative volume of pores of 10 μm or smaller was taken as the pore volume.
[Method of Measuring O/Ln Molar Ratio]

The oxygen content (mass %) was measured by inert gas fusion-IR absorption spectrometry, and the measured value was converted to the number of moles of oxygen per kg of the powder. The rare earth content (mass %) was measured by perchloric acid digestion/ICP-AES, and the measured value was converted to the number of moles of the rare earth per kg of the powder. The O/Ln molar ratio was calculated by dividing the number of moles of oxygen per kg of the powder by the number of moles of the rare earth element per kg of the powder.
[Method of Measuring Aspect Ratio]

The aspect ratio was obtained by photographing an SEM (scanning electron microscope) image of the powder. The magnifications were $1000/D_{50}$ to $50000/D_{50}$, and SEM images of at least 20 particles that did not overlap with one another were photographed, from, where needed, different fields of view. The micrograph was enlarged if necessary. The length and breadth of the 20 or more particles were measured, from which the aspect ratio, i.e., the length/the breadth, of the individual particles was calculated. After calculating the aspect ratio of the individual particles, the arithmetic mean thereof was obtained, which was taken as the aspect ratio of the powder.

A coating was formed using each of the coating powders obtained in Examples and Comparative Examples by the method below.

Coating Formation 1: Plasma Thermal Spraying (Coating Powder)

An 100 mm square aluminum alloy plate was used as a substrate. A coating was formed on the substrate by plasma thermal spraying. A powder feeder TPP-5000 available from Kyuyou-Giken Co., Ltd. was use for feeding the coating powder (the powder for thermal spraying). As a plasma thermal spraying apparatus, 100HE available from Progressive Surface Inc. was used. Plasma thermal spraying was carried out under the following conditions to form a thermal spray coating having a thickness of about 150 to 200 μm: argon gas flow rate, 84.6 L/min; nitrogen gas flow rate, 56.6 L/min; hydrogen gas flow rate, 56.6 L/min; output power, 105 kW; gun-to-substrate distance, 70 mm; and powder feed rate, 10 g/min. The plasma thermal spraying process is abbreviated as "PS" in Table 3 below.

Examples 16 to 21 and Comparative Examples 3 and 4

A coating powder was prepared in the same manner as in Example 9, except that the firing temperature was changed as shown in Table 1 and that, when the firing temperature was 1150° C. or higher, the firing was performed in an argon gas atmosphere. The resulting powder was evaluated in the same manner as in Example 9, and a thermal spray coating was formed using the resulting powder in the same manner as in Example 9.

Examples 22 to 25 and Comparative Examples 5 and 6

A coating powder was prepared in the same manner as in Example 9, except for using yttrium fluoride having a $D_{50}$ as shown in Table 1 as the yttrium fluoride to be used in the mixing step of step 1. Evaluation of the resulting coating powder and coating formation using the powder were conducted in the same manner as in Example 9.

The yttrium fluoride used in step 1, whose $D_{50}$ was as shown in Table 1, was prepared by grinding yttrium fluoride having a size of several millimeters (coarse particles to be ground to obtain the aforementioned yttrium fluoride product available from Nippon Yttrium Co., Ltd.) in a dry ball mill to the $D_{50}$ shown in Table 1 using grinding balls having an adjusted size (3 to 10 mm in diameter) for an adjusted grinding time.

Example 26

A coating powder was prepared in the same manner as in Example 9, except for using yttrium oxide ($D_{50}$: 3.1 μm) available from Nippon Yttrium Co., Ltd. as the yttrium oxide to be used in the mixing step of step 1. Evaluation of the resulting coating powder and coating formation using the powder were conducted in the same manner as in Example 9.

Examples 27 to 29 and Comparative Example 7

A coating powder was prepared in the same manner as in Example 9, except for changing the firing temperature in step 2 to 800° C. and changing the wet grinding conditions in step 3 as shown in Table 1A. Evaluation of the resulting coating powder and coating formation using the powder were conducted in the same manner as in Example 9.

Example 30 and 31 and Comparative Example 8

A coating powder was prepared in the same manner as in Example 9, except that the grinding in step 3 was performed only by dry grinding in a ball mill. Evaluation of the resulting coating powder and coating formation using the powder were conducted in the same manner as in Example 9.

In Table 1A, "B3", "B5", and "B10" indicate that YSZ balls having diameters of 3 mm, 5 mm, and 10 mm, respectively, were used. The grinding time was 6 hours.

Example 32

A coating powder was prepared in the same manner as in Example 9, except that the grinding in step 3 was performed only by dry grinding in Supermasscolloider (indicated by "M" in Table 1A). Evaluation of the resulting coating powder and coating formation using the powder were conducted in the same manner as in Example 9.

Example 33

A coating powder was prepared in the same manner as in Example 9, except that the grinding in step 3 was performed only by single-stage wet grinding in a wet ball mill using balls of 3 mm in diameter for 6 hours (dry grinding was not conducted). Evaluation of the resulting coating powder and coating formation using the powder were conducted in the same manner as in Example 9.

Example 34

A coating powder was prepared in the same manner as in Example 9, except for replacing the yttrium oxide used in step 1 with yttrium carbonate ($Y_2(CO_3)_3$, $D_{50}$: 6.5 μm) as a compound capable of becoming an oxide on firing. Evaluation of the resulting coating powder and coating formation using the powder were conducted in the same manner as in Example 9.

Example 35 (Coating Material in the Form of Slurry; Plasma Thermal Spraying)

The coating powder obtained in Example 9 was mixed with a water/ethanol mixture (ethanol 15 vol %) to prepare a coating material in the form of slurry having the coating powder content of 35 mass %. The viscosity of the resulting slurry at 25° C. was found to be 4 cp as measured using SV-10 from A & D Co. The coating slurry was sprayed by plasma spraying to form a thermal spray coating in the same manner as described supra (Coating formation 1: plasma thermal spraying), except that the slurry was fed using a liquid feeder HE from Progressive Surface Inc. at a rate of 36 ml/min.

Example 36 (Coating Powder of Example 9, High Velocity Oxygen Fuel Spraying (HVOF))

A thermal spray coating was formed using the coating powder of Example 9 by high velocity oxygen fuel spraying (HVOF).

As a substrate, a 100 mm square aluminum alloy plate was used. On this substrate, a thermal spray coating was formed by high velocity oxygen fuel spraying (HVOF). A powder feeder TPP-5000 from Kyuyou-Giken Co., Ltd. was used for feeding the coating powder (the powder for thermal spraying). As a high velocity oxygen fuel spraying (HVOF) apparatus, TopGun from GTV GmbH was used. High velocity oxygen fuel spraying (HVOF) was conducted under the following conditions to obtain a thermal spray coating with a thickness of about 150 to 200 µm: acetylene gas flow rate, 70 L/min; oxygen gas flow rate, 250 L/min; gun-to-substrate distance, 100 mm; and powder feed rate, 10 g/min.

The high velocity oxygen fuel spraying process is abbreviated as "HVOF" in Table 3A below.

Example 37 (Coating Powder of Example 9, Electron Beam Vacuum Evaporation)

A coating was formed using the coating powder of Example 9 by electron beam vacuum evaporation.

As a substrate, a 100 mm square aluminum alloy plate was used. On this substrate, electron beam vacuum evaporation was carried out. EB-680 from Eiko Engineering Co., Ltd. was used as an electron beam vacuum evaporation system.

The deposition chamber pressure was about $1\times10^{-3}$ Pa and the electron beam output power was 4 kW. A coating with a deposit thickness of 20 to 30 µm was prepared.

In Table 3A, "EBVD" indicates electron beam vacuum evaporation deposition.

Example 38 (Coating Powder of Example 9, Ion Plating)

A coating was formed using the coating powder of Example 9 by radiofrequency ion plating under the conditions described below.

The fluorine concentration of the coating powder was found to be 19.8 mass % as measured by the method below.

As a substrate, a 100 mm square aluminum alloy plate was used. On this substrate, radiofrequency ion plating was carried out.

The ion plating conditions were as follows: argon gas pressure, 0.02 Pa; EB output power, 0.6 kW; RF power, 1 kW; DC accelerating voltage, 1.5 kV; and source-to-substrate distance, 300 mm. A coating with a thickness of 20 to 30 µm was prepared.

The ion plating process is abbreviated as "IP" in Table 3A.
Method for Measuring Fluorine Concentration:

The fluorine concentration was measured by X-ray fluorescence spectroscopy (XRF) using Rigaku ZSX Primus II.

Example 39 (Coating Powder of Example 28, Aerosol Deposition (AD))

A coating was formed by aerosol deposition (AD) using the coating powder obtained in Example 28. As a substrate, a 100 mm square aluminum alloy plate was used. On this substrate, aerosol deposition was carried out.

Aerosol deposition conditions were as follows: argon gas: 5 L/min; oscillation frequency of oscillator for aerosolization: 30 Hz; oscillation amplitude of oscillator for aerosolization: 1 mm; aerosolization pressure: 40 kPa; and deposition chamber pressure: 100 Pa. A coating with a thickness of 150 to 200 µm was prepared.

The aerosol deposition process is abbreviated as "AD" in Table 3A.

Example 40 (Preparation Conditions of Example 39, Aerosol Deposition (AD))

A coating was formed by aerosol deposition using the coating powder obtained under the same preparation conditions as in Example 39. The substrate and the coating conditions were the same as in Example 39.

Comparative Example 9 (Preparation Condition of Dry Grinding of Example 39, Aerosol Deposition (AD))

A coating was formed by aerosol deposition using a coating powder prepared in exactly the same manner as in Example 39 up to the step of dry grinding, but in this case, the wet grinding was carried in a single stage in a wet ball mill using 2 mm diameter balls for 150 hours. The substrate and the coating conditions were the same as in Example 39.

Example 41 (Coating Material in the Form of Sintered Compact, Electron Beam Vacuum Evaporation Deposition (EBVD))

(1) Preparation of Sintered Compact

The coating powder of Example 9 was compacted by die pressing under a pressure of 49 MPa, followed by isotactic pressing under a pressure of 294 MPa.

The resulting green body was fired in an electric oven at 1500° C. for 2 hours in an argon atmosphere and spontaneously cooled in the oven down to 150° C. to obtain a sintered compact, which was machined to 150 mm in diameter and 5 mm in thickness.
(2) Coating A coating was formed using the resulting coating material in the form of sintered compact by electron beam evaporation deposition.

As a substrate, a 100 mm square aluminum plate was used. On this substrate, electron beam vacuum evaporation was carried out. Remodeled EBAD-1000 from AOV Co., Ltd. was used as an electron beam vacuum deposition system.

The deposition chamber pressure was about $1\times10^{-3}$ Pa and the electron beam output power was 4 kW. A coating with a thickness of 20 to 30 µm was prepared.

Example 42 (Coating Material in the Form of Sintered Compact, Ion Plating)

A coating was formed by radiofrequency ion plating using a coating material in the form of sintered compact prepared in the same manner as in Example 41.

The coating material in the form of sintered compact was prepared from the coating powder of Example 9. The fluorine concentration of the coating material was measured again and was found to be 21.4 mass %.

Ion plating conditions were as follows: argon gas pressure, 0.02 Pa; EB output power, 0.6 kW; RF output power, 1 kW; DC accelerating voltage, 1.5 kV; and source-to-substrate distance, 300 mm. A coating with a thickness of 20 to 30 µm was prepared.

Example 43 (Coating Material in the Form of Sintered Compact, Sputtering)

The coating material in the form of sintered compact prepared in the same manner as in Example 41, except for its size. The sintered body was lathed to a disk of 180 mm in diameter and 5 mm in thickness. A coating was formed on a 100 mm by 100 mm aluminum alloy plate using the resulting coating material by RF magnetron sputtering.

The sputtering conditions were as follows: argon gas pressure, 5 Pa; RF frequency, 13.56 MHz; plate voltage, 200 V; and RF power, 200 W. A coating with a thickness of 20 to 30 μm was prepared.

The sputtering process is abbreviated as "SP" in Table 3A.

Comparative Example 10 (Coating Material in the Form of Sintered Compact, Ion Plating)

A coating material in the form of sintered compact was prepared from the powder of Comparative Example 1 in the same manner as in Example 42. A coating was formed using the resulting coating material by RF ion plating (IP process).

The fluorine concentration of the coating powder obtained in Comparative Example 1 was 38.7 mass %. The substrate and the coating conditions were the same as in Example 42.

Examples 44 to Example 49 (Coating Powder Other than Y, Plasma Thermal Spraying)

In these Examples, a rare earth element other than Y was used as shown in Table 1A (Ce, Sm, Gd, Dy, Er, or Yb).

A coating material was prepared in the same manner as in Example 9, except that fine powder of a rare earth oxide ($Ln_xO_y$) containing a rare earth element other than Y (available from Nippon Yttrium Co., Ltd; having the $D_{50}$ shown in Table 1A) and a rare earth fluoride containing a rare earth element other than Y ($LnF_3$: available from Nippon Yttrium Co., Ltd; having the $D_{50}$ shown in Table 1A) were used in step 1. The resulting coating powder was evaluated in the same manner as in Example 9, and a thermal spray coating was formed using the resulting powder in the same manner as in Example 9. When the rare earth element was Ce, $CeO_2$ was used as $Ln_xO_y$, and when the rare earth element was Sm, Gd, Dy, Er, or Yb, a sesquioxide ($Ln_2O_3$) was used as $Ln_xO_y$.

The results of evaluation of the coating powders obtained in Examples 1 to 49 and Comparative Examples 1 to 10 are shown in Tables 2, 2A, 2B, and 2C.

Evaluation of Coating:

The coatings obtained in Examples and Comparative Examples were evaluated for denseness by measuring the number of cracks and porosity by the methods described below. The coatings were also evaluated for resistance to corrosion by plasma by the method below. The surface roughness of the coatings was evaluated by the method below. The results of evaluation are shown in Tables 3 and 3A.

[Method for Measuring Number of Cracks]

The coatings formed by various processes were each cut to a 2 cm square with a diamond wet cutter. The cut piece was buried in an epoxy resin, and a cut surface was abraded using a diamond slurry. The abraded surface was observed under an FE-SEM at a magnification of 500. The number of cracks appearing in a 100 μm square (corresponding to a 50 mm square in magnified view at a magnification of 500) freely chosen from the observed surface (the abraded cut surface of the coating) was counted. The coating was rated according to the following scale on the basis of the number of cracks.

A: No cracks are observed.
B: One to two cracks are observed.
C: Three to five cracks are observed.
D: More than five cracks are observed.

[Method for Measuring Porosity]

Each coating was cut to a 2 cm square with a diamond wet cutter and buried in an epoxy resin. A cut surface of the coating was abraded with a diamond slurry, and the abraded surface was observed under an optical microscope. The porosity (vol %) was calculated through image analysis of the optical micrograph. A smaller porosity indicates higher denseness of the coating.

[Method for Evaluating Resistance to Particle Shedding]

The each coating formed on the 100 mm square aluminum alloy plate was subjected to plasma etching. A 3-inch diameter silicon wafer was placed in the chamber before carrying out plasma etching. The number of particles having a particle size of about 0.2 μm or greater out of the particles shed from the coating due to the etching action and attached to the surface of the silicon wafer was counted using a magnifier. The plasma etching was conducted using a fluorine-based plasma under the following conditions:

Atmosphere gas, $CHF_3$:Ar:$O_2$=80:160:100 ml/min
RF power, 1300 W
Pressure, 4 Pa
Temperature, 60° C.
Etching time, 50 hours.

The plasma etching and counting the number of particles were conducted in the same manner, except for replacing the atmosphere gas $CHF_3$ with HCl to create a chlorine-based plasma.

[Method for Measuring Surface Roughness]

The surface roughness of each coating formed on the 100 mm square aluminum alloy plate was measured. An arithmetic average roughness Ra and maximum height roughness Rz (both specified by JIS B0601:2001) were determined using a stylus profilometer (specified in JIS B0651:2001).

TABLE 1

| | | Preparation Conditions | | | | | | | | | |
|---|---|---|---|---|---|---|---|---|---|---|---|
| | | Oxide/Compound That Becomes Oxide on Firing | | Fluoride | | Firing Conditions | | | Wet Grinding | | | |
| | | | | | | | | | 1st Stage Bead | | 2nd Stage Bead | |
| | Rare Earth Element | Kind | $D_{50}$ (μm) | $D_{50}$ (μm) | $LnF_3/Ln^*$ Molar Ratio | Temp. (° C.) | Time (hr) | Dry Grinding | Diameter (mm) | Time (hr) | Diameter (mm) | Time (hr) |
| Example 1 | Y | oxide | 0.24 | 7.4 | 55 | 950 | 8 | A | 2 | 2 | 1.2 | 0.5 |
| Example 2 | | | | | 30 | | | | | | | |
| Example 3 | | | | | 20 | | | | | | | |
| Example 4 | | | | | 10 | | | | | | | |
| Example 5 | | | | | 5.0 | | | | | | | |

TABLE 1-continued

| | | Preparation Conditions | | | | | | | | | |
|---|---|---|---|---|---|---|---|---|---|---|---|
| | | Oxide/Compound That Becomes Oxide on Firing | | Fluoride | Firing Conditions | | | Wet Grinding | | | |
| | | | | | | | | 1st Stage | | 2nd Stage | |
| | | | | | | | | Bead | | Bead | |
| | Rare Earth Element | Kind | $D_{50}$ (μm) | $D_{50}$ (μm) | $LnF_3/Ln^*$ Molar Ratio | Temp. (° C.) | Time (hr) | Dry Grinding | Diameter (mm) | Time (hr) | Diameter (mm) | Time (hr) |
| Example 6 | | | | | 3.0 | | | | | | | |
| Example 7 | | | | | 1.5 | | | | | | | |
| Example 8 | | | | | 1.0 | | | | | | | |
| Example 9 | | | | | 0.87 | | | | | | | |
| Example 10 | | | | | 0.80 | | | | | | | |
| Example 11 | | | | | 0.70 | | | | | | | |
| Example 12 | | | | | 0.60 | | | | | | | |
| Example 13 | | | | | 0.50 | | | | | | | |
| Example 14 | | | | | 0.45 | | | | | | | |
| Example 15 | | | | | 0.40 | | | | | | | |
| Compara. Example 1 | | | | | 100 | | | | | | | |
| Compara. Example 2 | | | | | 0.20 | | | | | | | |
| Example 16 | Y | oxide | 0.24 | 7.4 | 0.87 | 750 | 8 | A | 2 | 2 | 1.2 | 0.5 |
| Example 17 | | | | | | 850 | | | | | | |
| Example 18 | | | | | | 1050 | | | | | | |
| Example 19 | | | | | | 1150 | | | | | | |
| Example 20 | | | | | | 1250 | | | | | | |
| Example 21 | | | | | | 1400 | | | | | | |
| Compara. Example 3 | | | | | | 650 | | | | | | |
| Compara. Example 4 | | | | | | 1450 | | | | | | |
| Example 22 | Y | oxide | 0.24 | 6.0 | 0.87 | 950 | 8 | A | 2 | 2 | 1.2 | 0.5 |
| Example 23 | | | | 49 | | | | | | | | |
| Example 24 | | | | 96 | | | | | | | | |
| Example 25 | | | | 470 | | | | | | | | |
| Compara. Example 5 | | | | 3.0 | | | | | | | | |
| Compara. Example 6 | | | | 620 | | | | | | | | |

*Dry grinding machine A: atomizer

TABLE 1A

| | | Preparation Conditions | | | | | | | | | |
|---|---|---|---|---|---|---|---|---|---|---|---|
| | | Oxide/Compound That Becomes Oxide on Firing | | Fluoride | Firing Conditions | | | Wet Grinding | | | |
| | | | | | | | | 1st Stage | | 2nd Stage | |
| | | | | | | | | Bead | | Bead | |
| | Rare Earth Element | Kind | $D_{50}$ (μm) | $D_{50}$ (μm) | $LnF_3/Ln^*$ Molar Ratio | Temp. (° C.) | Time (hr) | Dry Grinding | Diameter (mm) | Time (hr) | Diameter (mm) | Time (hr) |
| Example 26 | Y | oxide | 3.1 | 7.4 | 0.87 | 950 | 8 | A | 2 | 2 | 1.2 | 0.5 |
| Example 27 | Y | Oxide | 0.24 | 7.4 | 0.87 | 800 | 8 | A | 0.8 | 4 | 0.4 | 10 |
| Example 28 | | | | | | | | | | | | 3 |
| Example 29 | | | | | | | | | | | | 2 |
| Compara. Example 7 | | | | | | | | | | | | 20 |
| Example 30 | Y | oxide | 0.24 | 7.4 | 0.87 | 950 | 8 | B3 | — | — | — | — |
| Example 31 | | | | | | | | B5 | — | — | — | — |
| Compara. Example 8 | | | | | | | | B10 | — | — | — | — |
| Example 32 | | | | | | | 8 | M | — | — | — | — |
| Example 33 | | | | | | | 8 | — | 3 | 6 | — | — |
| Example 34 | Y | carbonate | 6.5 | 7.4 | 0.87 | 950 | 8 | A | 2 | 2 | 1.2 | 0.5 |
| Example 35 | Y | oxide | 0.24 | 7.4 | 0.87 | 950 | 8 | A | 2 | 2 | 1.2 | 0.5 |
| Example 36 | | | | | | | | | | | | |
| Example 37 | | | | | | | | | | | | |
| Example 38 | | | | | | | | | | | | |
| Example 39 | | | | | | 800 | 8 | A | 0.8 | 4 | 0.4 | 3 |
| Example 40 | | | | | | | | | | | | |

TABLE 1A-continued

| | Preparation Conditions | | | | | | | | | | | |
|---|---|---|---|---|---|---|---|---|---|---|---|---|
| | Oxide/Compound That Becomes | | | | | | | Wet Grinding | | | | |
| | | | | | | | | 1st Stage | | 2nd Stage | | |
| | Rare Earth Element | Oxide on Firing Kind | $D_{50}$ (μm) | Fluoride $D_{50}$ (μm) | $LnF_3/Ln^*$ Molar Ratio | Firing Conditions Temp. (°C.) | Time (hr) | Dry Grinding | Bead Diameter (mm) | Time (hr) | Bead Diameter (mm) | Time (hr) |
| Compara. Example 9 | | | | | | | | | 2 | 150 | — | — |
| Example 41 | | | | | | 950 | 8 | A | 2 | 2 | 1.2 | 0.5 |
| Example 42 | | | | | | | | | | | | |
| Example 43 | | | | | | | | | | | | |
| Comp. Example 10 | Y | oxide | 0.24 | 7.4 | 100 | | | | | | | |
| Example 44 | Ce | oxide | 0.33 | 8.5 | 0.87 | 950 | 8 | A | 2 | 2 | 1.2 | 0.5 |
| Example 45 | Sm | oxide | 0.42 | 7.2 | | | | | | | | |
| Example 46 | Gd | oxide | 0.22 | 6.7 | | | | | | | | |
| Example 47 | Dy | oxide | 0.27 | 10.2 | | | | | | | | |
| Example 48 | Er | oxide | 0.18 | 8.5 | | | | | | | | |
| Example 49 | Yb | oxide | 0.29 | 9.2 | | | | | | | | |

Dry grinding machine:
A: atomizer
B3: dry ball mill (3 mm diameter balls)
B5: dry ball mill (5 mm diameter balls)
B10: dry ball mill (10 mm diameter balls)
M: Supermasscolloider

TABLE 2

| | Coating Powder | | | | | | | | | | | | |
|---|---|---|---|---|---|---|---|---|---|---|---|---|---|
| | Particle Size Distribution (μm) | | | Dispersion Index | Pore Volume of Pores with Diameter of ≤10 μm (cm³/g) | Pore Size Peak (μm) | BET Specific Surface Area (m²/g) | XRD Peak Intensity & Peak Intensity Ratio | | | | | O/Ln |
| | $D_{50}$ | $D_{10}$ | $D_{90}$ | | | | | $LnF_3$ (S2) | Ln-O-F (S1) | $Ln_xO_y$ (S0) | S0/S1 | S1/S2 | Molar Ratio | Aspect Ratio |
| Example 1 | 3.3 | 2.2 | 4.5 | 0.34 | 0.27 | 2.5 | 2.2 | 100 | 4 | 0 | 0 | 0.04 | 0.03 | 1.2 |
| Example 2 | 3.4 | 2.2 | 4.5 | 0.34 | 0.30 | 2.3 | 1.9 | 100 | 7 | 0 | 0 | 0.07 | 0.05 | 1.1 |
| Example 3 | 3.3 | 2.3 | 4.4 | 0.31 | 0.28 | 2.2 | 1.7 | 100 | 11 | 0 | 0 | 0.11 | 0.07 | 1.4 |
| Example 4 | 3.2 | 2.3 | 4.4 | 0.31 | 0.26 | 2.4 | 1.6 | 100 | 21 | 0 | 0 | 0.21 | 0.14 | 1.2 |
| Example 5 | 3.3 | 2.2 | 4.4 | 0.33 | 0.32 | 2.4 | 2.0 | 100 | 45 | 0 | 0 | 0.45 | 0.26 | 1.0 |
| Example 6 | 3.3 | 2.4 | 4.5 | 0.30 | 0.30 | 2.3 | 1.8 | 100 | 93 | 0 | 0 | 0.93 | 0.40 | 1.0 |
| Example 7 | 3.2 | 2.2 | 4.3 | 0.32 | 0.34 | 2.4 | 1.8 | 0 | 100 | 0 | 0 | — | 0.63 | 1.3 |
| Example 8 | 3.3 | 2.3 | 4.3 | 0.30 | 0.31 | 2.2 | 1.7 | 0 | 100 | 0 | 0 | — | 0.77 | 1.2 |
| Example 9 | 3.2 | 2.4 | 4.5 | 0.30 | 0.33 | 2.0 | 1.6 | 0 | 100 | 0 | 0 | — | 0.83 | 1.2 |
| Example 10 | 3.1 | 2.3 | 4.5 | 0.32 | 0.32 | 2.3 | 1.7 | 0 | 100 | 0 | 0 | — | 0.86 | 1.4 |
| Example 11 | 3.2 | 2.3 | 4.4 | 0.31 | 0.30 | 2.1 | 1.7 | 0 | 100 | 0 | 0 | — | 0.90 | 1.2 |
| Example 12 | 3.1 | 2.2 | 4.3 | 0.32 | 0.34 | 2.2 | 1.8 | 0 | 100 | 0 | 0 | — | 0.96 | 1.3 |
| Example 13 | 3.3 | 2.4 | 4.4 | 0.29 | 0.35 | 2.3 | 1.9 | 0 | 100 | 0 | 0 | — | 1.02 | 1.2 |
| Example 14 | 3.3 | 2.3 | 4.4 | 0.31 | 0.37 | 2.1 | 1.7 | 0 | 100 | 4 | 0.04 | — | 1.05 | 1.3 |
| Example 15 | 3.4 | 2.3 | 4.5 | 0.32 | 0.34 | 2.1 | 1.8 | 0 | 100 | 15 | 0.15 | — | 1.10 | 1.2 |
| Comp. Example 1 | 3.5 | 2.3 | 4.7 | 0.34 | 0.25 | 2.4 | 2.0 | 100 | 0 | 0 | — | 0 | 0.01 | 1.0 |
| Comp. Example 2 | 3.4 | 2.2 | 4.7 | 0.36 | 0.40 | 2.8 | 2.5 | 0 | 91 | 100 | 1.1 | — | 1.3 | 1.2 |
| Example 16 | 2.0 | 1.3 | 2.7 | 0.35 | 0.48 | 4.2 | 7.1 | 0 | 100 | 0 | 0 | — | 0.82 | 1.3 |
| Example 17 | 2.6 | 2.0 | 3.9 | 0.32 | 0.41 | 3.4 | 4.3 | 0 | 100 | 0 | 0 | — | 0.82 | 1.2 |
| Example 18 | 4.2 | 2.7 | 5.5 | 0.34 | 0.29 | 1.4 | 1.5 | 0 | 100 | 0 | 0 | — | 0.84 | 1.1 |
| Example 19 | 5.9 | 3.3 | 8.9 | 0.46 | 0.25 | 0.73 | 1.2 | 0 | 100 | 0 | 0 | — | 0.85 | 1.0 |
| Example 20 | 7.7 | 4.0 | 12 | 0.50 | 0.20 | 0.43 | 1.1 | 0 | 100 | 0 | 0 | — | 0.83 | 1.2 |
| Example 21 | 9.2 | 4.6 | 21 | 0.64 | 0.10 | 0.21 | 0.91 | 0 | 100 | 0 | 0 | — | 0.83 | 1.3 |
| Comp. Example 3 | 1.7 | 1.1 | 2.6 | 0.41 | 0.60 | 6.1 | 13 | 0 | 100 | 0 | 0 | — | 0.82 | 1.1 |
| Comp. Example 4 | 12.3 | 5.8 | 30 | 0.68 | 0.04 | 0.06 | 0.65 | 0 | 100 | 0 | 0 | — | 0.83 | 1.4 |
| Example 22 | 2.8 | 1.9 | 4.1 | 0.37 | 0.12 | 0.95 | 1.5 | 0 | 100 | 0 | 0 | — | 0.83 | 1.2 |
| Example 23 | 3.5 | 2.2 | 5.0 | 0.39 | 0.37 | 2.5 | 1.6 | 0 | 100 | 0 | 0 | — | 0.82 | 1.1 |
| Example 24 | 4.2 | 2.7 | 8.2 | 0.50 | 0.41 | 3.5 | 1.6 | 0 | 100 | 0 | 0 | — | 0.81 | 1.3 |
| Example 25 | 5.7 | 3.1 | 12 | 0.59 | 0.48 | 4.7 | 1.8 | 0 | 100 | 0 | 0 | — | 0.81 | 1.2 |
| Comp. Example 5 | 2.5 | 1.5 | 3.8 | 0.43 | 0.57 | 0.15 | 1.4 | 0 | 100 | 0 | 0 | — | 0.84 | 1.3 |
| Comp. Example 6 | 7.1 | 3.8 | 25 | 0.74 | 0.05 | 5.8 | 2.2 | 0 | 100 | 0 | 0 | — | 0.81 | 1.2 |

TABLE 2A

| | Coating Powder | | | | | | | | | | | | | |
|---|---|---|---|---|---|---|---|---|---|---|---|---|---|---|
| | Particle Size Distribution (µm) | | | Dispersion Index | Pore Volume of Pores with Diameter of ≤10 µm (cm³/g) | Pore Size Peak (µm) | BET Specific Surface Area (m²/g) | XRD Peak Intensity & Peak Intensity Ratio | | | | | O/Ln Molar Ratio | Aspect Ratio |
| | $D_{50}$ | $D_{10}$ | $D_{90}$ | | | | | LnF$_3$ (S2) | Ln-O-F (S1) | Ln$_x$O$_y$ (S0) | S0/S1 | S1/S2 | | |
| Example 26 | 3.8 | 2.7 | 5.4 | 0.33 | 0.30 | 2.5 | 1.4 | 0 | 100 | 0 | 0 | — | 0.83 | 1.2 |
| Example 27 | 0.12 | 0.079 | 0.16 | 0.34 | 0.46 | 0.18 | 9.5 | 0 | 100 | 0 | 0 | — | 0.82 | 1.1 |
| Example 28 | 0.55 | 0.37 | 0.76 | 0.35 | 0.23 | 0.55 | 6.3 | 0 | 100 | 0 | 0 | — | 0.82 | 1.3 |
| Example 29 | 1.3 | 0.82 | 1.7 | 0.35 | 0.11 | 1.1 | 2.6 | 0 | 100 | 0 | 0 | — | 0.81 | 1.2 |
| Comp. Example 7 | 0.044 | 0.033 | 0.064 | 0.32 | 0.62 | 0.04 | 15 | 0 | 100 | 0 | 0 | — | 0.84 | 1.3 |
| Example 30 | 7.2 | 3.1 | 42 | 0.86 | 0.27 | 2.9 | 1.5 | 0 | 100 | 0 | 0 | — | 0.83 | 1.0 |
| Example 31 | 9.6 | 5.3 | 68 | 0.86 | 0.24 | 3.4 | 1.4 | 0 | 100 | 0 | 0 | — | 0.82 | 1.1 |
| Comp. Example 8 | 12.5 | 6.9 | 87 | 0.85 | 0.20 | 3.6 | 1.3 | 0 | 100 | 0 | 0 | — | 0.81 | 1.1 |
| Example 32 | 6.2 | 2.4 | 54 | 0.91 | 0.29 | 2.7 | 1.5 | 0 | 100 | 0 | 0 | — | 0.82 | 1.0 |
| Example 33 | 4.1 | 2.1 | 12 | 0.70 | 0.31 | 2.5 | 1.5 | 0 | 100 | 0 | 0 | — | 0.82 | 1.1 |
| Example 34 | 3.6 | 2.7 | 5.1 | 0.31 | 0.32 | 2.2 | 1.5 | 0 | 100 | 0 | 0 | — | 0.82 | 1.3 |
| Example 35 | 3.2 | 2.4 | 4.5 | 0.30 | 0.33 | 2.0 | 1.6 | 0 | 100 | 0 | 0 | — | 0.83 | 1.3 |
| Example 36 | | | | | | | | | | | | | | 1.0 |
| Example 37 | | | | | | | | | | | | | | 1.1 |
| Example 38 | | | | | | | | | | | | | | 1.2 |
| Example 39 | 0.55 | 0.37 | 0.76 | 0.35 | 0.23 | 0.55 | 6.3 | 0 | 100 | 0 | 0 | — | 0.82 | 1.0 |
| Example 40 | 0.55 | 0.38 | 0.85 | 0.38 | 0.24 | 0.55 | 5.4 | 0 | 100 | 0 | 0 | — | 0.82 | 1.3 |
| Comp. Example 9 | 0.55 | 0.1 | 4.00 | 0.95 | 0.51 | 0.65 | 2.1 | 0 | 100 | 0 | 0 | — | 0.82 | 8.0 |
| Example 41 | 3.2 | 2.4 | 4.5 | 0.30 | 0.33 | 2.0 | 1.6 | 0 | 100 | 0 | 0 | — | 0.83 | 1.2 |
| Example 42 | | | | | | | | | | | | | | 1.2 |
| Example 43 | 3.2 | 2.4 | 4.5 | 0.30 | 0.33 | 2.0 | 1.6 | 0 | 100 | 0 | 0 | — | 0.83 | 1.3 |
| Comp. Example 10 | 3.2 | 2.4 | 4.5 | 0.30 | 0.33 | 2.0 | 1.6 | 100 | 0 | 0 | — | 0 | 0.01 | 1.4 |
| Example 44 | 3.4 | 2.5 | 4.9 | 0.32 | 0.35 | 2.0 | 1.9 | 0 | 100 | 0 | 0 | — | 0.84 | 1.2 |
| Example 45 | 3.3 | 2.3 | 4.7 | 0.34 | 0.35 | 1.9 | 1.7 | 0 | 100 | 0 | 0 | — | 0.82 | 1.2 |
| Example 46 | 3.1 | 2.0 | 4.2 | 0.35 | 0.33 | 2.1 | 1.8 | 0 | 100 | 0 | 0 | — | 0.83 | 1.1 |
| Example 47 | 3.2 | 2.3 | 4.5 | 0.32 | 0.33 | 2.2 | 1.8 | 0 | 100 | 0 | 0 | — | 0.83 | 1.4 |
| Example 48 | 3.1 | 2.1 | 4.2 | 0.33 | 0.34 | 2.3 | 1.6 | 0 | 100 | 0 | 0 | — | 0.82 | 1.3 |
| Example 49 | 3.3 | 2.4 | 4.5 | 0.30 | 0.35 | 2.2 | 1.7 | 0 | 100 | 0 | 0 | — | 0.83 | 1.2 |

TABLE 2B

| | Ln-O-F Detected by XRD (assignment of max. peak of Ln-O-F) |
|---|---|
| Example 1 | Y$_7$O$_6$F$_9$ |
| Example 2 | Y$_7$O$_6$F$_9$ |
| Example 3 | Y$_7$O$_6$F$_9$ |
| Example 4 | Y$_7$O$_6$F$_9$ |
| Example 5 | Y$_7$O$_6$F$_9$ |
| Example 6 | Y$_7$O$_6$F$_9$ |
| Example 7 | Y$_5$O$_4$F$_7$ |
| Example 8 | Y$_5$O$_4$F$_7$ |
| Example 9 | Y$_5$O$_4$F$_7$ |
| Example 10 | Y$_7$O$_6$F$_9$ |
| Example 11 | Y$_7$O$_6$F$_9$ |
| Example 12 | YOF |
| Example 13 | YOF |
| Example 14 | YOF |
| Example 15 | YOF |
| Compara. Example 1 | — |
| Compara. Example 2 | YOF |
| Example 16 | Y$_5$O$_4$F$_7$ |
| Example 17 | Y$_5$O$_4$F$_7$ |
| Example 18 | Y$_7$O$_6$F$_9$ |
| Example 19 | Y$_7$O$_6$F$_9$ |
| Example 20 | Y$_5$O$_4$F$_7$ |
| Example 21 | Y$_5$O$_4$F$_7$ |
| Compara. Example 3 | Y$_5$O$_4$F$_7$ |
| Compara. Example 4 | Y$_5$O$_4$F$_7$ |
| Example 22 | Y$_5$O$_4$F$_7$ |
| Example 23 | Y$_5$O$_4$F$_7$ |
| Example 24 | Y$_5$O$_4$F$_7$ |
| Example 25 | Y$_5$O$_4$F$_7$ |
| Compara. Example 5 | Y$_7$O$_6$F$_9$ |
| Compara. Example 6 | Y$_5$O$_4$F$_7$ |

TABLE 2C

| | Ln-O-F Detected by XRD (assignment of max. peak of Ln-O-F) |
|---|---|
| Example 26 | Y$_5$O$_4$F$_7$ |
| Example 27 | Y$_5$O$_4$F$_7$ |
| Example 28 | Y$_5$O$_4$F$_7$ |
| Example 29 | Y$_5$O$_4$F$_7$ |
| Compara. Example 7 | Y$_7$O$_6$F$_9$ |
| Example 30 | Y$_5$O$_4$F$_7$ |
| Example 31 | Y$_5$O$_4$F$_7$ |
| Compara. Example 8 | Y$_5$O$_4$F$_7$ |
| Example 32 | Y$_5$O$_4$F$_7$ |
| Example 33 | Y$_5$O$_4$F$_7$ |
| Example 34 | Y$_5$O$_4$F$_7$ |
| Example 35 | Y$_5$O$_4$F$_7$ |
| Example 36 | Y$_5$O$_4$F$_7$ |
| Example 37 | Y$_5$O$_4$F$_7$ |
| Example 38 | Y$_5$O$_4$F$_7$ |
| Example 39 | Y$_5$O$_4$F$_7$ |
| Example 40 | Y$_5$O$_4$F$_7$ |
| Compara. Example 9 | Y$_5$O$_4$F$_7$ |
| Example 41 | Y$_5$O$_4$F$_7$ |
| Example 42 | Y$_5$O$_4$F$_7$ |
| Example 43 | Y$_5$O$_4$F$_7$ |
| Compara. Example 10 | — |
| Example 44 | Ce$_7$O$_6$F$_9$ |
| Example 45 | Sm$_5$O$_4$F$_7$ |
| Example 46 | Gd$_5$O$_4$F$_7$ |
| Example 47 | Dy$_5$O$_4$F$_7$ |
| Example 48 | Er$_5$O$_4$F$_7$ |
| Example 49 | Yb$_5$O$_4$F$_7$ |

TABLE 3

| | Form of Feed | Coating Process | Coating Cracking | Porosity (vol %) | Number of Particles F-based Plasma | Number of Particles Cl-based Plasma | Surface Roughness (μm) Ra | Surface Roughness (μm) Rz |
|---|---|---|---|---|---|---|---|---|
| Example 1 | powder | PS | B | 5 | 15 | 20 | 1.5 | 1.7 |
| Example 2 | | | A | <3 | 7 | 9 | 1.3 | 1.9 |
| Example 3 | | | A | <3 | 5 | 4 | 1.2 | 1.6 |
| Example 4 | | | A | <3 | 5 | 5 | 1.1 | 1.6 |
| Example 5 | | | A | <3 | 3 | 4 | 1.3 | 1.7 |
| Example 6 | | | A | <3 | 4 | 3 | 1.2 | 1.8 |
| Example 7 | | | A | <3 | 3 | 3 | 1.2 | 1.9 |
| Example 8 | | | A | <3 | 1 | 2 | 1.3 | 1.8 |
| Example 9 | | | A | <3 | 0 | 1 | 1.2 | 1.7 |
| Example 10 | | | A | <3 | 3 | 1 | 1.3 | 1.9 |
| Example 11 | | | A | <3 | 2 | 3 | 1.4 | 1.6 |
| Example 12 | | | A | <3 | 3 | 5 | 1.2 | 1.5 |
| Example 13 | | | A | <3 | 4 | 7 | 1.4 | 1.9 |
| Example 14 | | | A | <3 | 7 | 10 | 1.2 | 1.5 |
| Example 15 | | | B | 5 | 9 | 20 | 1.2 | 1.9 |
| Compara. Example 1 | | | C | 7 | 25 | 29 | 1.1 | 1.5 |
| Compara. Example 2 | | | D | 21 | 35 | 97 | 1.2 | 1.6 |
| Example 16 | powder | PS | A | <3 | 17 | 19 | 1.1 | 1.9 |
| Example 17 | | | A | 9 | 9 | 10 | 1.4 | 1.8 |
| Example 18 | | | A | <3 | 4 | 5 | 1.1 | 1.6 |
| Example 19 | | | A | 5 | 4 | 4 | 1.4 | 1.8 |
| Example 20 | | | A | 9 | 6 | 5 | 1.4 | 1.9 |
| Example 21 | | | A | <3 | 4 | 5 | 1.1 | 1.5 |
| Compara. Example 3 | | | B | 12 | 32 | 38 | 5.4 | 8.5 |
| Compara. Example 4 | | | D | 42 | 38 | 44 | 2.1 | 5.6 |
| Example 22 | powder | PS | A | 5 | 1 | 2 | 1.1 | 1.9 |
| Example 23 | | | A | <3 | 3 | 5 | 1.4 | 1.8 |
| Example 24 | | | A | <3 | 10 | 13 | 1.2 | 1.9 |
| Example 25 | | | A | <3 | 15 | 20 | 1.4 | 1.6 |
| Compara. Example 5 | | | C | 23 | 21 | 25 | 1.1 | 1.6 |
| Compara. Example 6 | | | C | 27 | 28 | 35 | 5.4 | 9.5 |

*Coating process
PS: plasma thermal spraying

TABLE 3A

| | Form of Feed | Coating Process | Coating Cracking | Porosity (vol % 5) | Number of Particles F-based Plasma | Number of Particles Cl-based Plasma | Surface Roughness (μm) Ra | Surface Roughness (μm) Rz |
|---|---|---|---|---|---|---|---|---|
| Example 26 | powder | PS | A | 5 | 5 | 4 | 1.4 | 1.9 |
| Example 27 | powder | PS | A | 4 | 16 | 18 | 1.2 | 1.8 |
| Example 28 | | | A | 10 | 10 | 9 | 1.2 | 1.5 |
| Example 29 | | | A | 5 | 5 | 5 | 1.2 | 1.9 |
| Compara. Example 7 | | | A | 20 | 38 | 42 | 1.4 | 1.9 |
| Example 30 | | | B | <3 | 13 | 11 | 1.1 | 1.9 |
| Example 31 | | | B | 6 | 16 | 18 | 1.4 | 1.8 |
| Compara. Example 8 | | | D | 12 | 35 | 47 | 4.5 | 12.0 |
| Example 32 | | | B | <3 | 15 | 17 | 1.1 | 1.9 |
| Example 33 | | | A | <3 | 9 | 10 | 1.4 | 1.9 |
| Example 34 | | | A | <3 | 3 | 3 | 1.5 | 1.2 |
| Example 35 | | slurry | A | <3 | 1 | 1 | 1.0 | 1.8 |
| Example 36 | powder | HVOF | A | 9 | 5 | 7 | 1.2 | 1.9 |
| Example 37 | | EBVD | A | <3 | 13 | 12 | 1.1 | 1.9 |
| Example 38 | | IP | A | <3 | 2 | 3 | 1.1 | 1.8 |
| Example 39 | | AD | A | <3 | 0 | 0 | 1.0 | 1.5 |
| Example 40 | | | A | <3 | 0 | 0 | 1.0 | 1.5 |
| Compara. Example 9 | | | A | 12 | 45 | 34 | 1.5 | 3.0 |

TABLE 3A-continued

| | | Coating | | Porosity | Number of Particles | | Surface Roughness (μm) | |
| | | | | | F-based | Cl-based | | |
| | Form of Feed | Process | Cracking | (vol % 5) | Plasma | Plasma | Ra | Rz |
|---|---|---|---|---|---|---|---|---|
| Example 41 | Sintered | EBVD | A | 10 | 7 | 8 | 1.4 | 1.3 |
| Example 42 | compact | IP | A | <3 | 2 | 1 | 1.5 | 1.2 |
| Example 43 | | SP | A | 5 | 3 | 5 | 1.0 | 1.7 |
| Compara. Example 10 | Sintered compact | IP | A | <3 | 21 | 21 | 1.4 | 1.7 |
| Example 44 | powder | PS | A | <3 | 2 | 2 | 1.1 | 1.5 |
| Example 45 | | | A | <3 | 1 | 2 | 1.2 | 1.6 |
| Example 46 | | | A | <3 | 2 | 1 | 1.0 | 1.5 |
| Example 47 | | | A | <3 | 2 | 2 | 1.1 | 1.8 |
| Example 48 | | | A | <3 | 1 | 2 | 1.4 | 1.5 |
| Example 49 | | | A | <3 | 1 | 0 | 1.2 | 1.4 |

*Coating process:
PS: plasma thermal spraying
HVOF: high velocity oxygen fuel spraying
EBVD: electron beam vacuum evaporation deposition
IP: ion plating
SP: sputtering
AD: aerosol deposition As is apparent from the results shown in Tables 3 and 3A, all the coatings formed by using the coating powders and coating materials prepared in Examples exhibit no or little cracking, low porosity, small surface roughness, and low particle shedding when exposed to each of fluorine-based plasma and chlorine-based plasma. In contrast, the coatings of Comparative Examples show considerable cracking and/or high porosity, indicating poor denseness, and/or exhibit high particle shedding. As can be seen from the results of Comparative Examples 3, 4, 6, 8, and 9, coatings of many of Comparative Examples, in which the pore volume and the average particle size are out of the scope of the invention, revealed to be inferior in denseness in terms of surface roughness. In particular, when comparison is made between Examples 39 and 40 and Comparative Example 9, in which the coating was formed by the AD process, the coating of Comparative Example 9 is inferior to that of Examples 39 and 40 in surface roughness.

The invention claimed is:

1. A coating powder, being a non-granulated powder, comprising a rare earth oxyfluoride (Ln-O—F) and having:
  an average particle size ($D_{50}$) of 0.1 to 9.6 μm,
  a cumulative volume of all pores having a diameter of 10 μm or smaller and 0.001 μm or larger of 0.1 to 0.5 cm$^3$/g as measured by mercury intrusion porosimetry, and
  a ratio of the maximum peak intensity (S0) assigned to a rare earth oxide ($Ln_xO_y$) in the 2θ angle range of from 20° to 40° to the maximum peak intensity (S1) assigned to the rare earth oxyfluoride (Ln-O—F) in the same range, S0/S1, of 1.0 or smaller in powder X-ray diffractometry using Cu-Kα rays or Cu-Kα$_1$ rays,
  wherein said coating powder has a pore size peak in the range of from 2.2 μm to 5 μm in the pore size distribution of pores having a diameter of 10 μm or smaller measured by mercury intrusion porosimetry with pore size as abscissa and log differential pore volume as ordinate, and the BET specific surface area of said coating powder is 1.2 to 10 m$^2$/g,
  wherein Ln-O—F is a compound represented by $LnO_xF_y$, and
  wherein x and y are 0.35≤x≤1.65, 0.5≤y≤1.5, 2.35≤2x+y≤5.1, and Ln is selected from the group consisting of Y, Sm, Gd, Ce, Er and Yb.

2. The coating powder according to claim 1, comprising a rare earth fluoride (LnF$_3$) in addition to the rare earth oxyfluoride (Ln-O—F).

3. The coating powder according to claim 1, having a ratio of the maximum peak intensity (S0) assigned to a rare earth oxide ($Ln_xO_y$) in the 2θ angle range of from 20° to 40° to the maximum peak intensity (S1) assigned to the rare earth oxyfluoride (Ln-O—F) in the same range, S0/S1, of 0.10 or smaller in powder X-ray diffractometry using Cu-Kα rays or Cu-Kα$_1$ rays.

4. The coating powder according to claim 1, having a ratio of the number of moles of oxygen (O) per kg of the powder to the number of moles of the rare earth (Ln) per kg of the powder, O/Ln by mole, of 0.03 to 1.1.

5. The coating powder according to claim 1, wherein the rare earth is yttrium (Y).

6. A method of forming a coating comprising carrying out physical vapor deposition, aerosol deposition, or thermal spraying of the coating powder according to claim 1.

7. The method according to claim 6, wherein the physical vapor deposition is vacuum evaporation or ion plating.

8. A coating material comprising the coating powder according to claim 1.

9. The coating material according to claim 8, being in the form of slurry.

10. A method of forming a coating comprising carrying out thermal spraying of the coating material according to claim 9.

11. A coating material comprising a sintered compact of the coating powder according to claim 1.

12. The coating material according to claim 11, being used to form a coating by physical vapor deposition.

13. The coating material according to claim 12, wherein the physical vapor deposition is vacuum evaporation, ion plating, or sputtering.

14. The coating powder according to claim 1, having a ratio of the maximum peak intensity (S0) assigned to a rare earth oxide ($Ln_xO_y$) in the 2θ angle range of from 20° to 40° to the maximum peak intensity (S1) assigned to the rare earth oxy fluoride (Ln-O—F) in the same range, S0/S1, of 0.05 or smaller in powder X-ray diffractometry using Cu-Kα rays or Cu-Kα$_1$ rays, having a BET specific surface area of 1.5 to 8 m$^2$/g,
having an aspect ratio of 1.0 to 3.0, and
having a dispersion index of 0.2 to 0.5.

\* \* \* \* \*